United States Patent
Haneda

(10) Patent No.: US 10,303,125 B2
(45) Date of Patent: May 28, 2019

(54) TIME-TO-DIGITAL CONVERTER, CIRCUIT DEVICE, PHYSICAL QUANTITY MEASURING DEVICE, ELECTRONIC APPARATUS, AND VEHICLE

(71) Applicant: Seiko Epson Corporation, Tokyo (JP)

(72) Inventor: Hideo Haneda, Matsumoto (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 16/111,292

(22) Filed: Aug. 24, 2018

(65) Prior Publication Data

US 2019/0064748 A1 Feb. 28, 2019

(30) Foreign Application Priority Data

Aug. 25, 2017 (JP) .................. 2017-161967

(51) Int. Cl.
*H03K 3/03* (2006.01)
*G04F 10/00* (2006.01)

(52) U.S. Cl.
CPC ......... *G04F 10/005* (2013.01); *H03K 3/0315* (2013.01)

(58) Field of Classification Search
CPC ....... H03M 1/50; H03K 3/0315; G04F 10/005
USPC .................................. 341/122–166
See application file for complete search history.

(56) References Cited

U.S. PATENT DOCUMENTS

| | | | |
|---|---|---|---|
| 8,081,101 B2* | 12/2011 | Daniels | H03M 1/1042 341/143 |
| 2016/0282889 A1* | 9/2016 | Mahajan | G05F 1/575 |
| 2018/0088160 A1* | 3/2018 | Maki | G01R 23/10 |
| 2018/0091156 A1* | 3/2018 | Maki | H03B 5/368 |
| 2018/0091158 A1* | 3/2018 | Sudo | G04F 10/005 |
| 2018/0267480 A1* | 9/2018 | Mahajan | G04F 10/005 |

FOREIGN PATENT DOCUMENTS

JP 64-079687 A 3/1989

* cited by examiner

*Primary Examiner* — Lam T Mai
(74) *Attorney, Agent, or Firm* — Harness, Dickey & Pierce, P.L.C.

(57) ABSTRACT

A time-to-digital converter includes first and second oscillation circuits, first and second sampling circuits, and a processing circuit. The first and second oscillation circuits start an oscillation operation in accordance with first and second signals and output first and second clock signals, respectively. The first and second sampling circuits perform sampling of the first and second clock signals by a first reference clock signal and output first and second output signals, respectively. The processing circuit obtains first frequency information and first phase information of the first clock signal and second frequency information and second phase information of the second clock signal based on the first and second output signals of the first and second sampling circuits, and obtains a digital value corresponding to a time difference of a transition timing between the first and second signals.

15 Claims, 18 Drawing Sheets

US 10,303,125 B2

TIME-TO-DIGITAL CONVERTER, CIRCUIT DEVICE, PHYSICAL QUANTITY MEASURING DEVICE, ELECTRONIC APPARATUS, AND VEHICLE

BACKGROUND

1. Technical Field

The present invention relates to a time-to-digital converter, a circuit device, a physical quantity measuring device, an electronic apparatus, and a vehicle.

2. Related Art

Examples of a technology of measuring a time interval between a start signal and a stop signal in the related art include a technology disclosed in JP-A-64-79687. JP-A-64-79687 discloses a reference oscillator, a second oscillator, and a timekeeping circuit. The reference oscillator generates a start signal and starts oscillation at a frequency f. The second oscillator generates a stop signal and starts oscillation at a frequency (f+Δf). The timekeeping circuit measures a time interval between the start signal and the stop signal by comparing a phase of a first clock pulse of the reference oscillator and a phase of a second clock pulse of the second oscillator.

However, in the configuration of the technology in the related art, for example, a situation in which obtaining sufficient timekeeping accuracy is not possible may occur by factors such as temperature characteristics, variations in process, and jitter characteristics, which cause deterioration of a clock signal generated by an oscillator. For example, an oscillator having favorable characteristics, such as a crystal oscillator, has difficulty in control of start. Thus, the above-described technology has a problem that the first timekeeping operation may not be normally performed.

SUMMARY

An advantage of some aspects of the invention is to solve at least a part of the problems described above, and the invention can be implemented as the following forms or embodiments.

An aspect of the invention relates to a time-to-digital converter including a first oscillation circuit that starts an oscillation operation in accordance with a first signal and outputs a first clock signal, a second oscillation circuit that starts an oscillation operation in accordance with a second signal and outputs a second clock signal, a first sampling circuit that performs sampling of the first clock signal by a first reference clock signal and outputs a first output signal, a second sampling circuit that performs sampling of the second clock signal by the first reference clock signal and outputs a second output signal, and a processing circuit that obtains first frequency information and first phase information of the first clock signal and second frequency information and second phase information of the second clock signal based on the first output signal of the first sampling circuit and the second output signal of the second sampling circuit, and obtains a digital value corresponding to a time difference of a transition timing between the first signal and the second signal based on the first frequency information, the second frequency information, the first phase information, and the second phase information.

According to the aspect of the invention, the first and second oscillation circuits start an oscillation operation in accordance with the first and second signals and output the first and second clock signals. The first and second sampling circuits perform sampling of the first and second clock signals by the first reference clock signal and outputs the first and second output signals. The processing circuit obtains the first frequency information and the first phase information of the first clock signal and the second frequency information and the second phase information of the second clock signal based on the first and second output signals from the first and second sampling circuits, and obtains the digital value corresponding to the time difference of the transition timing between the first signal and the second signal. According to this configuration, it is possible to obtain the digital value corresponding to the time difference of the transition timing between the first and second signals by the time-to-digital converter constituted by the first and second oscillation circuits, the first and second sampling circuits, and the processing circuit.

In the aspect of the invention, the processing circuit may include a counter that performs a counting operation based on the first reference clock signal and a storage circuit that fetches first clock count number information based on a count value of the counter at a timing corresponding to a transition timing of the first output signal and second clock count number information based on a count value of the counter at a timing corresponding to a transition timing of the second output signal.

According to this configuration, it is possible to realize time-digital conversion by the simple circuit configuration and processing in which the counter performs the counting operation of the first reference clock signal, and first and second clock count number information regarding count values of timings corresponding to transition timings of the first and second output signals is fetched in the storage circuit.

In the aspect of the invention, the processing circuit may further include an arithmetic circuit that performs an arithmetic operation of the first frequency information, the second frequency information, the first phase information, and the second phase information based on the first clock count number information and the second clock count number information.

According to this configuration, it is possible to realize time-digital conversion with high accuracy by digital arithmetic processing using the simple circuit configuration.

In the aspect of the invention, the processing circuit may be configured to specify a first straight line and obtain first inclination information and first intercept information of the first straight line, based on a plurality of points in which a value on a first coordinate axis means a clock count number indicated by the first clock count number information, and a value on a second coordinate axis means a transition count value of the first output signal, to specify a second straight line and obtain second inclination information and second intercept information of the second straight line, based on a plurality of points in which a value on the first coordinate axis means a clock count number indicated by the second clock count number information, and a value on the second coordinate axis means a transition count value of the second output signal, and to obtain the first frequency information, the second frequency information, the first phase information, and the second phase information based on the first inclination information, the second inclination information, the first intercept information, and the second intercept information.

According to this configuration, it is possible to obtain the first frequency information and the first phase information of the first clock signal and the second frequency information and the second phase information of the second clock signal by the digital arithmetic processing using the clock count number based on the count value of the counter.

In the aspect of the invention, the processing circuit may obtain first time information from a reference timing until a transition timing of the first signal and second time information from the reference timing until a transition timing of the second signal, and obtain the digital value corresponding to the time difference of the transition timing between the first signal and the second signal based on the first time information and the second time information.

According to this configuration, it is possible to realize time-digital conversion for the first and second signals by obtaining first and second time information from the reference timing to the transition timings of the first and second signals.

In the aspect of the invention, the first oscillation circuit may be a ring oscillator that starts the oscillation operation at a transition timing of the first signal. The second oscillation circuit may be a ring oscillator that starts the oscillation operation at a transition timing of the second signal.

According to this configuration, it is possible to generate the first and second clock signals oscillating in accordance with the first and second signals and to obtain the digital value corresponding to the time difference of the transition timing between the first and second signals, by using the ring oscillators having a simple configuration.

In the aspect of the invention, when a frequency of the first reference clock signal is set as f1, a frequency of the first clock signal is set as fa, and a frequency of the second clock signal is set as fb, (f1/2)<fa<f1 and (f1/2)<fb<f1 may be satisfied.

According to this configuration, it is possible to suitably perform sampling of the first and second clock signals by the first reference clock signal. It is possible to suitably obtain the first frequency information and the first phase information of the first clock signal and the second frequency information and the second phase information of the second clock signal by using the first and second output signals of the first and second sampling circuits.

In the aspect of the invention, the time-to-digital converter may further include a third sampling circuit that performs sampling of a second reference clock signal by the first reference clock signal and outputs a third output signal, a fourth sampling circuit that performs sampling of the first clock signal by the second reference clock signal and outputs a fourth output signal, a fifth sampling circuit that performs sampling of the second clock signal by the second reference clock signal and outputs a fifth output signal, and a sixth sampling circuit that performs sampling of the first reference clock signal by the second reference clock signal and outputs a sixth output signal. The processing circuit may obtain the first frequency information and the first phase information of the first clock signal and the second frequency information and the second phase information of the second clock signal based on the first to sixth output signals of the first to sixth sampling circuits.

According to this configuration, it is possible to suitably obtain the first frequency information and the first phase information of the first clock signal and the second frequency information and the second phase information of the second clock signal by using the two reference clock signals and using the output signals of the six sampling circuits. Thus, it is possible to improve performance of time-digital conversion.

In the aspect of the invention, the processing circuit may obtain first time information from a reference timing which is a phase synchronization timing between the first reference clock signal and the second reference clock signal until a transition timing of the first signal and second time information from the reference timing until a transition timing of the second signal, and obtain the digital value corresponding to the time difference of the transition timing between the first signal and the second signal based on the first time information and the second time information.

According to this configuration, since the first and second time information from the reference timing to the transition timings of the first and second signals are obtained by using the phase synchronization timing between the first and second reference clock signals, as the reference timing, it is possible to realize time-digital conversion for the first and second signals.

In the aspect of the invention, the processing circuit may obtain the first frequency information, the second frequency information, the first phase information, and the second phase information by performing correction processing based on the third output signal of the third sampling circuit and the sixth output signal of the sixth sampling circuit.

According to this configuration, it is possible to suitably obtain the first frequency information and the first phase information of the first clock signal and the second frequency information and the second phase information of the second clock signal by the correction processing using the third output signal of the third sampling circuit and the sixth output signal of the sixth sampling circuit.

In the aspect of the invention, when a frequency of the first reference clock signal is set as f1, a frequency of the second reference clock signal is set as f2, a frequency of the first clock signal is set as fa, and a frequency of the second clock signal is set as fb, f1 may be different from f2. (f1/2)<fa<f1, (f1/2)<fb<f1, (f2/2)<fa<f2, and (f2/2)<fb<f2 may be satisfied.

According to this configuration, it is possible to suitably perform sampling of the first and second clock signals by the first and second reference clock signals. It is possible to suitably obtain the first frequency information and the first phase information of the first clock signal and the second frequency information and the second phase information of the second clock signal by using the first and second output signals of the first and second sampling circuits.

Another aspect of the invention relates to a circuit device including the time-to-digital converter described above.

Still another aspect of the invention relates to a physical quantity measuring device including the time-to-digital converter described above.

Still another aspect of the invention relates to an electronic apparatus including the time-to-digital converter described above.

Still another aspect of the invention relates to a vehicle including the time-to-digital converter described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the preferred embodiment of the invention will be described in detail. The embodiment which will be described below does not unduly limit the contents of the invention described in the appended claims, and all the configurations described in the embodiment are not indispensable as means for solving the invention.

1. Time-to-Digital Converter

Figure 1:
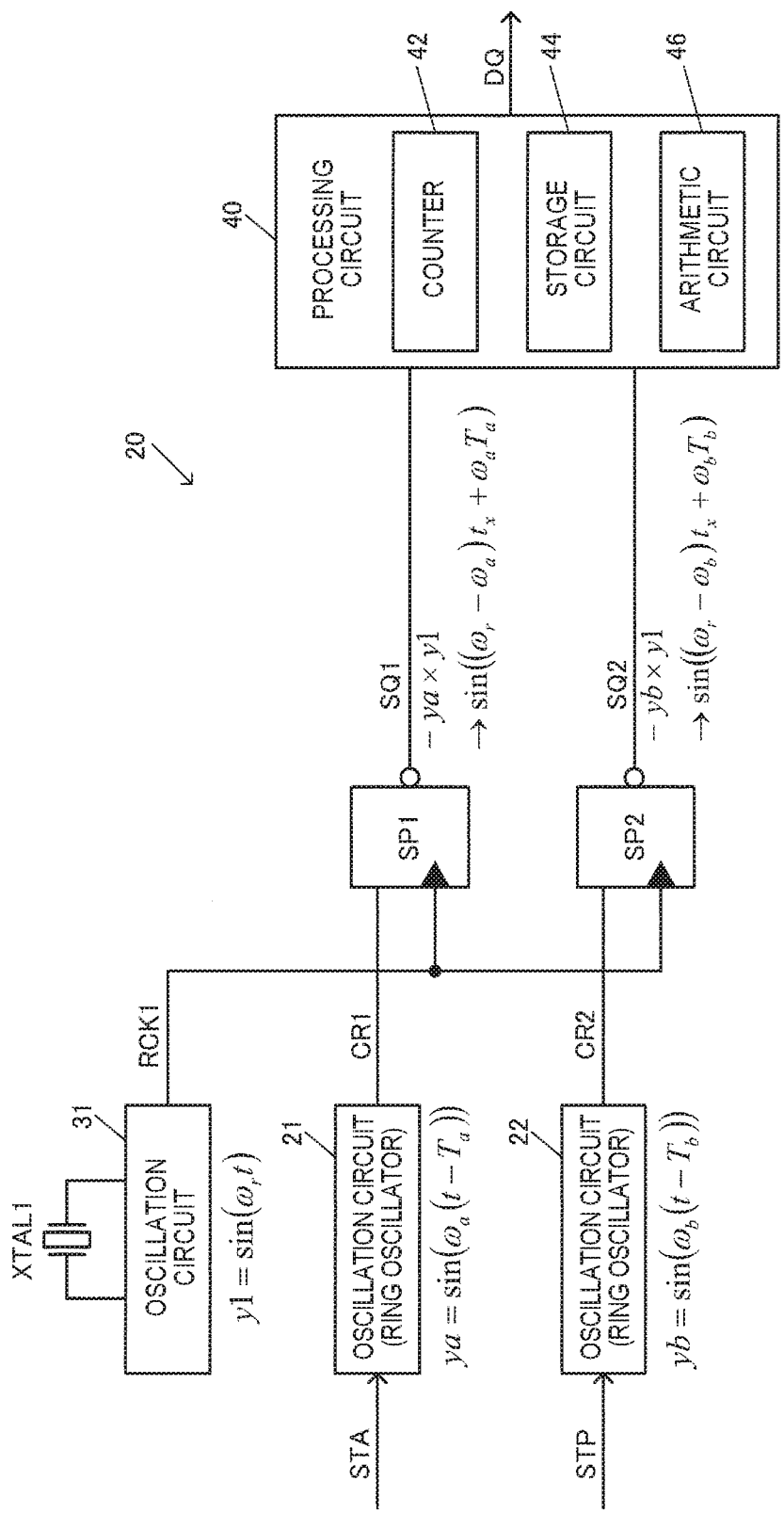
FIG. 1 illustrates a configuration example of a time-to-digital converter according to an embodiment.

FIG. 1 illustrates a basic configuration example of a time-to-digital converter 20 according to an embodiment. The time-to-digital converter 20 includes oscillation circuits 21 and 22, sampling circuits SP1 and SP2, and a processing circuit 40. The time-to-digital converter 20 is not limited to the configuration in FIG. 1. Various modifications as follows may be made. For example, some components of the time-to-digital converter may be omitted, or other components may be added.

The oscillation circuit (first oscillation circuit) 21 starts an oscillation operation in accordance with a signal STA (first signal, start signal) so as to output a clock signal (first clock signal) CR1. For example, the oscillation circuit 21 starts the oscillation operation at a transition timing (rising edge or falling edge) of the signal STA and outputs the clock signal CR1 generated by the oscillation operation. The oscillation circuit (second oscillation circuit) 22 starts an oscillation operation in accordance with a signal STP (second signal, stop signal) so as to output a clock signal (second clock signal) CR2. For example, the oscillation circuit 22 starts the oscillation operation at a transition timing of the signal STP and outputs the clock signal CR2 generated by the oscilla-tion operation. The oscillation circuits 21 and 22 can be realized by ring oscillators, for example.

The sampling circuit (first sampling circuit) SP1 performs sampling of the clock signal CR1 by a reference clock signal (first reference clock signal) RCK1 so as to output an output signal (first output signal) SQ1. For example, the sampling circuit SP1 outputs the output signal SQ1 obtained by performing sampling of the clock signal CR1 (voltage level of clock signal CR1) by the transition timing of the reference clock signal RCK1. For example, the sampling circuit (first mixer circuit) SP1 mixes the clock signal CR1 and the reference clock signal RCK1 and outputs the mixed signal as the output signal SQ1. The sampling circuit (second sampling circuit) SP2 performs sampling of the clock signal CR2 by the reference clock signal RCK1 so as to output an output signal (second output signal) SQ2. For example, the sampling circuit SP2 outputs the output signal SQ2 obtained by performing sampling of the clock signal CR2 (voltage level of clock signal CR2) by the transition timing of the reference clock signal RCK1. For example, the sampling circuit (second mixer circuit) SP2 mixes the clock signal CR2 and the reference clock signal RCK1 and outputs the mixed signal as the output signal SQ2. The sampling circuits SP1 and SP2 can be realized, for example, by sample-and-hold circuits configured by analog circuits.

The reference clock signal RCK1 is generated by an oscillation circuit 31. The oscillation circuit 31 generates the reference clock signal RCK1 by an oscillation operation using an oscillator XTAL1. The oscillator XTAL1 can be realized, for example, by a resonator element (piezoelectric resonator element) such as a quartz crystal resonator element. For example, the oscillator XTAL1 can be realized by a quartz crystal resonator element or the like which has a cut angle of AT cut, SC cut, or the like and performs thickness shear mode resonance. The oscillator XTAL1 is not limited thereto. For example, the oscillator may be realized by various resonator elements such as a resonator element (other than a thickness shear mode type) and a piezoelectric resonator element formed of a material other than quartz crystal. For example, a surface acoustic wave (SAW) resonator and a micro-electro mechanical system (MEMS) resonator as a silicon resonator may be used. A clock signal input from the outside of the circuit device 10 may be used as the reference clock signal RCK1.

The processing circuit 40 obtains a digital value DQ corresponding to a time difference of a transition timing between the signals STA and STP, based on the output signals SQ1 and SQ2 of the sampling circuits SP1 and SP2. Specifically, the processing circuit 40 obtains first frequency information and first phase information of the clock signal CR1 and second frequency information and second phase information of the clock signal CR2 based on the output signal SQ1 of the sampling circuit SP1 and the output signal SQ2 of the sampling circuit SP2. The processing circuit 40 obtains the digital value DQ corresponding to the time difference of the transition timing between the signals STA and STP, based on the first and second frequency information and first and second phase information. The time difference of the transition timing between the signals STA and STP refers to a time difference between edges (for example, rising edges or falling edges) of the signals STA and STP. The processing circuit (processor) 40 may be an ASIC circuit realized, for example, by automatic placement and routing of a gate array and the like. The processing circuit may be realized by a CPU, an MPU, or the like.

For example, the reference clock signal RCK1 of the oscillation circuit 31 and the clock signals CR1 and CR2 of the oscillation circuits 21 and 22 can be represented by sinusoidal expressions such as Expressions (1), (2), and (3).

$$y1 = \sin(\omega_r t) \quad (1)$$

$$ya = \sin(\omega_a(t - T_a)) \quad (2)$$

$$yb = \sin(\omega_b(t - T_b)) \quad (3)$$

Here, ωr, ωa, and ωb indicate angular frequencies corresponding to the clock frequencies RCK1, CR1, and CR2. Ta and Tb indicate information indicating phases (phases from the reference timing) of the clock signals CR1 and CR2.

Figure 2:
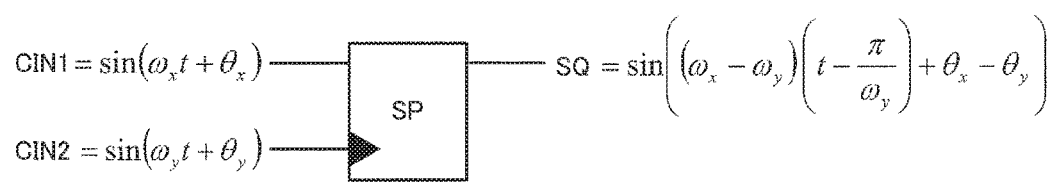
FIG. 2 is a diagram illustrating a sampling operation of a sampling circuit.

For example, as illustrated in FIG. 2, in a case where the sampling circuit SP performs sampling of a clock signal CIN1 by a clock signal CIN2, the output signal SQ can be approximately represented as in Expression (4).

$$\sin\left((\omega_x - \omega_y)\left(t - \frac{\pi}{\omega_y}\right) + \theta_x - \theta_y\right) \quad (4)$$

$$t_x = t - \frac{\pi}{\omega_y} \quad (5)$$

That is, the output signal SQ of the sampling circuit SP includes information (ωx and ωy) of frequencies of the clock signals CIN1 and CIN2 and information (θx and θy) of phases thereof. Specifically, the output signal SQ includes information (ωx−ωy) of a frequency difference between the clock signals CIN1 and CIN2 and information (θx−θy) of a phase difference therebetween. In Expression (4), the term shown in Expression (5) indicates that a delay of the half clock cycle occurs by latch of the sampling circuit SP. In the following descriptions, for the simple descriptions, tx(ty) may be appropriately described as t.

From Expression (4), the output signals SQ1 and SQ2 of the sampling circuits SP1 and SP2 in FIG. 1 can be approximately represented as in Expressions (6) and (7). That is, the output signals SQ1 and SQ2 include information represented by Expressions (6) and (7).

$$-ya \times y1 \rightarrow \sin((\omega_r - \omega_a)t_x + \varphi_a T_a) \quad (6)$$

$$-yb \times y1 \rightarrow \sin((\omega_r - \omega_b)t_x + \omega_b T_b) \quad (7)$$

The processing circuit 40 obtains first frequency information (ωa) and the first phase information (Ta) of the clock signal CR1 and second frequency information (ωb) and the second phase information (Tb) of the clock signal CR2 based on the output signals SQ1 and SQ2 of the sampling circuits SP1 and SP2. The processing circuit 40 obtains the digital value DQ corresponding to the time difference of the transition timing between the signals STA and STP based on the first and second frequency information and first and second phase information (ωa, ωb, Ta, and Tb) of the clock signals CR1 and CR2.

Figure 3:
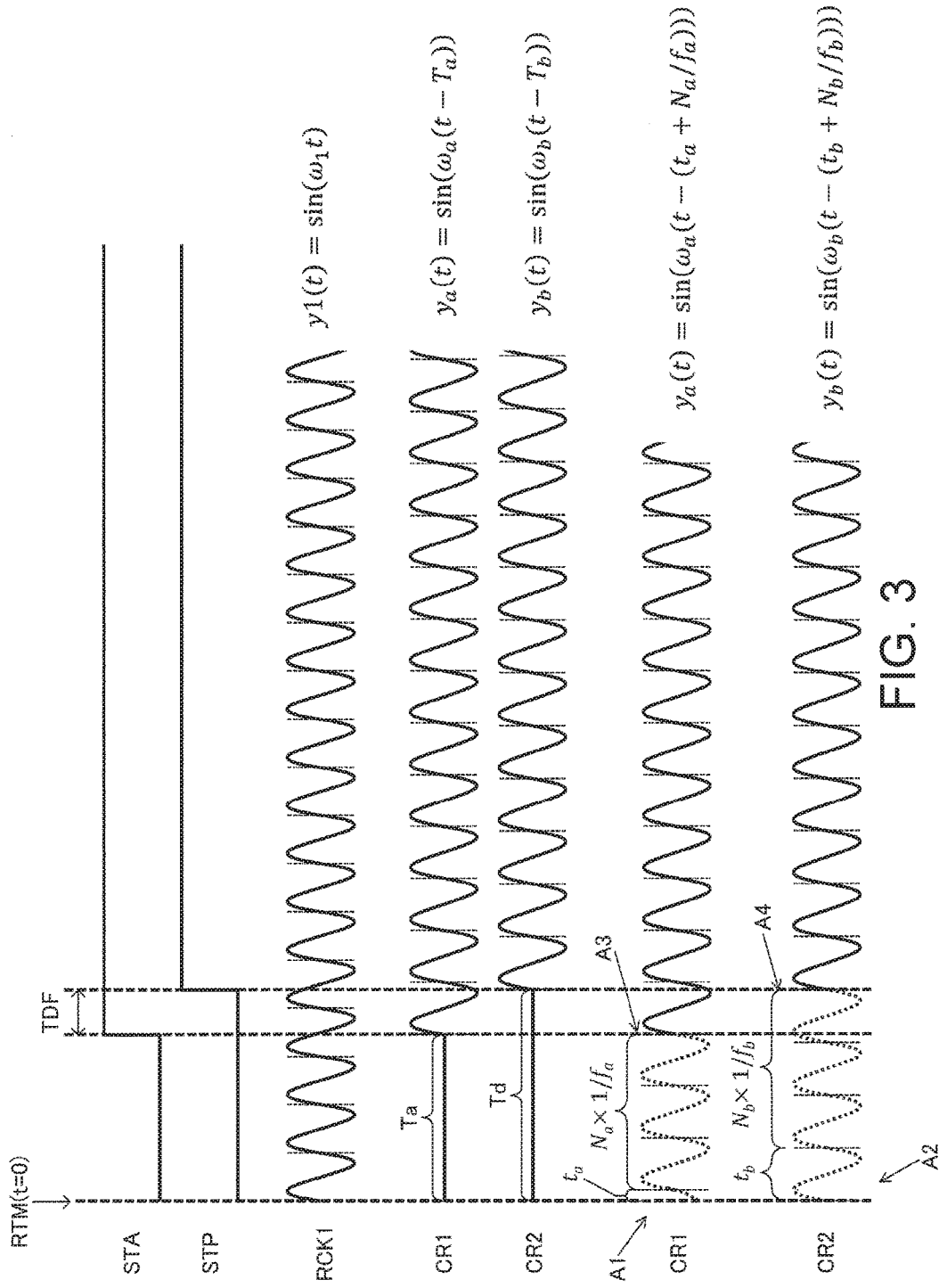
FIG. 3 illustrates a signal waveform example for describing an operation in the embodiment.

FIG. 3 illustrates a signal waveform example for describing an operation of the time-to-digital converter 20 in the embodiment. In FIG. 3, the time difference of the transition timing between the signal STA (start signal) and the signal STP (stop signal) is set as TDF. The processing circuit 40 obtains the time difference TDF by performing arithmetic processing of obtaining phase information Ta and Tb (first and second time information) of the clock signals CR1 and CR2. Information which is actually obtained by the processing circuit 40 through the arithmetic processing is information (ta and tb) of the phases of the clock signals CR1 and CR2 in the vicinity of the reference timing RTM (t=0), which is indicated by A1 and A2. Any timing such as a timing at which the phase of the reference clock signal RCK1 comes to, for example, 0 degree can be set as the reference timing RTM.

For example, if Ta is represented by ta+(Na/fa) and Tb is represented by tb+(Nb/fb), the clock signals CR1 and CR2 can be represented as in Expressions (8) and (9).

$$ya(t) = \sin(\omega_a(t - (t_a + N_a/f_a))) \quad (8)$$

$$yb(t) = \sin(\omega_b(t - (t_b + N_b/f_b))) \quad (9)$$

In Expressions (8) and (9), Na and Nb indicate the wavenumbers of the clock signals CR1 and CR2 in the sections A3 and A4 in FIG. 3. fa and fb indicate the frequencies of the clock signals CR1 and CR2. ta and tb indicate information indicating the phases of the clock signals CR1 and CR2 in the vicinity of the reference timing RTM, which is indicated by A1 and A2.

As described above, according to the embodiment, it is possible to obtain the digital value DQ corresponding to the time difference TDF between the signals STA and STP by the time-to-digital converter 20 having a simple circuit configuration constituted by the oscillation circuits 21 and 22, the sampling circuits SP1 and SP2, and the processing circuit 40. For example, the oscillation circuits 21 and 22 configured by ring oscillators or the like are prepared. As illustrated in FIG. 3, the oscillation operation of the oscillation circuits 21 and 22 is started at the transition timings (rising edges) of the signals STA and STP. Sampling is performed on the clock signals CR1 and CR2 output from the oscillation circuits 21 and 22, by the sampling circuits SP1 and SP2 with the reference clock signal RCK1 generated by using the oscillator XTAL1. Thus, the output signals SQ1 and SQ2 which are mixed signals of the clock signals CR1 and CR2 with the reference clock signal RCK1. The first and second frequency information (ωa and ωb) and the first and second phase information (Ta and Tb) of the clock signals CR1 and CR2, which are included in the output signals SQ1 and SQ2 are obtained by the digital arithmetic processing which is performed by the processing circuit 40. In this manner, it is possible to realize time-digital conversion of obtaining the digital value DQ corresponding to the time difference TDF between the signals STA and STP, with the simple circuit configuration as illustrated in FIG. 1. It is also possible to realize time-digital conversion with accuracy higher than that in the above-described technology in the related art. In particular, it is possible to improve the performance of time-digital conversion by generating the reference clock signal RCK1 by using the high-accuracy oscillator XTAL1 such as a quartz crystal resonator element.

As illustrated in FIG. 1, the processing circuit 40 includes a counter 42 and a storage circuit 44. The counter 42 performs a counting operation based on the reference clock signal RCK1. For example, the counter performs the counting operation of incrementing (or decrementing) the count value based on the reference clock signal RCK1. The storage circuit 44 fetches first clock count number information based on the count value of the counter 42 at a timing corresponding to the transition timing of the output signal SQ1. The storage circuit 44 fetches second clock count number information based on the count value of the counter 42 at a timing corresponding to the transition timing of the output signal SQ2. For example, the count value at the timing corresponding to the transition timing of the output signal SQ1 is read from the counter 42, and the first clock count number information based on the count value is fetched and stored in the storage circuit 44. The count value at the timing corresponding to the transition timing of the output signal SQ2 is read from the counter 42, and the second clock count number information based on the count value is fetched and stored in the storage circuit 44. The timing corresponding to the transition timing may be the transition timing itself, or may be a timing delayed from the transition timing by a predetermined period (predetermined clock count number). The first and second clock count number information based on the count values may indicate the count value itself, or may be information obtained in accordance with the count values (for example, difference value between the count values).

According to this configuration, it is possible to realize time-digital conversion of obtaining the time difference TDF by the simple circuit configuration and processing in which the counter 42 performs the counting operation of the reference clock signal RCK1, and first and second clock count number information regarding the count values of timings corresponding to transition timings of the output signals SQ1 and SQ2 is fetched in the storage circuit 44.

The processing circuit 40 includes an arithmetic circuit 46. The arithmetic circuit 46 performs arithmetic of the first and second frequency information ($\omega a$ and $\omega b$) and first and second phase information (Ta and Tb) of the clock signals CR1 and CR2 based on the first and second clock count number information fetched in the storage circuit 44. The arithmetic circuit 46 obtains the digital value DQ corresponding to the time difference TDF of the transition timing between the signals STA and STP as illustrated in FIG. 3, based on the first and second frequency information and the first and second phase information which have been obtained.

According to this configuration, it is possible to obtain the digital value DQ corresponding to the time difference TDF in a manner that the first and second clock count number information obtained by using the output signals SQ1 and SQ2 is fetched in the storage circuit 44, and the arithmetic circuit 46 performs digital arithmetic processing using the first and second clock count number information. Thus, it is possible to realize time-digital conversion with high accuracy, by the digital arithmetic processing using the simple circuit configuration.

The arithmetic circuit 46 (processing circuit 40 in a broad sense) specifies a first straight line and obtains first inclination information and first intercept information of the first straight line, based on a plurality of points in which the value on a first coordinate axis indicates the clock count number indicated by the first clock count number information and the value on a second coordinate axis indicates the transition count value of the output signal SQ1. The transition count value of the output signal SQ1 is a value obtained by counting the number of signal transitions of the output signal SQ1. The transition count value thereof indicates the number of times of transitions of the output signal SQ1 (number of rising edges or falling edges of the output signal).

The arithmetic circuit 46 (processing circuit 40) specifies a second straight line and obtains second inclination information and second intercept information of the second straight line, based on a plurality of points in which the value on the first coordinate axis indicates the clock count number indicated by the second clock count number information and the value on the second coordinate axis indicates the transition count value of the output signal SQ2. The transition count value of the output signal SQ2 is a value obtained by counting the number of signal transitions of the output signal SQ2. The transition count value thereof indicates the number of times of transitions of the output signal SQ2. The arithmetic circuit 46 obtains the first and second frequency information ($\omega a$ and $\omega b$) and the first and second phase information (Ta and Tb) of the clock signals CR1 and CR2 based on the first and second inclination information and the first and second intercept information.

Figure 4:
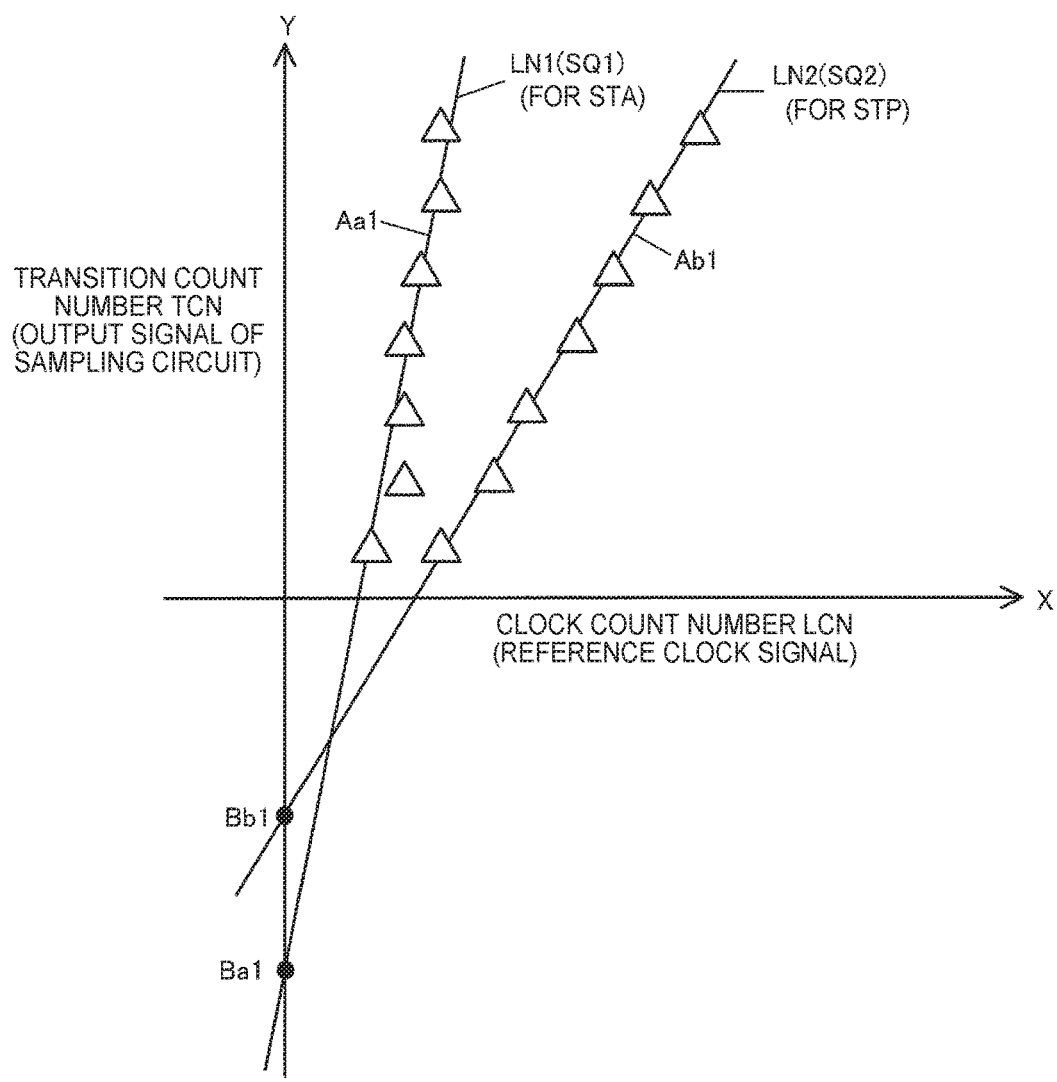
FIG. 4 is a diagram illustrating a method of obtaining inclination information and intercept information.

For example, in FIG. 4, the arithmetic circuit 46 specifies (sets) a straight line (first straight line) LN1 based on a plurality of points in which a value on an X-axis as the first coordinate axis indicates a clock count number LCN indicated by the first clock count number information and a value on a Y-axis as the second coordinate axis indicates a transition count value TCN of the output signal SQ1. The clock count number LCN based on the first clock count number information in this case is a count value of the counter 42 at a timing corresponding to the transition timing of the output signal SQ1, for example. The count value of the counter 42 is a value which increments (or decrements) based on the reference clock signal RCK1. The transition count value TCN of the output signal SQ1 is a value which increments (or decrements) for each transition of the signal level of the output signal SQ1 (for each rising edge or for each falling edge).

For example, the arithmetic circuit 46 obtains the straight line LN1 from a plurality of points (plot points) indicated by triangle marks in FIG. 4, based on the least-square method or the like. For example, the arithmetic circuit obtains the straight line LN1 (fitting straight line) in which the square sum of a difference between the value on a straight line satisfying y=ax+b based on a predicted value and the practical value at the point indicated by a triangle becomes the minimum. The arithmetic circuit 46 obtains an inclination Aa1 as the first inclination information of the straight line LN1 corresponding to the output signal SQ1 and an intercept Ba1 as the first intercept information of the straight line.

The arithmetic circuit 46 specifies (sets) a straight line (second straight line) LN2 based on a plurality of points in which a value on the X-axis as the first coordinate axis indicates a clock count number LCN indicated by the second clock count number information and a value on the Y-axis as the second coordinate axis indicates a transition count value TCN of the output signal SQ2. The clock count number LCN based on the second clock count number information in this case is a count value of the counter 42 at a timing corresponding to the transition timing of the output signal SQ2, for example. The transition count value TCN of the output signal SQ2 is a value which increments (or decrements) for each transition of the signal level of the output signal SQ2 (for each rising edge or for each falling edge). The arithmetic circuit 46 obtains an inclination Ab1 as the second inclination information of the straight line LN2 corresponding to the output signal SQ2 and an intercept Bb1 as the second intercept information of the straight line.

The arithmetic circuit 46 obtains the first and second frequency information ($\omega a$ and $\omega b$) and the first and second phase information (Ta and Tb) of the clock signals CR1 and CR2 based on pieces of information of the inclinations Aa1 and Ab1 and the intercepts Ba1 and Bb1 which have been obtained in this manner. For example, the arithmetic circuit obtains the first and second frequency information ($\omega a$ and $\omega b$) based on the pieces of information of the inclinations Aa1 and Ab1, and obtains the first and second phase information (Ta and Tb) based on the pieces of information of the intercepts Ba1 and Bb1. Then, the arithmetic circuit obtains the digital value DQ corresponding to the time difference TDF based on the first and second frequency information and the first and second phase information.

Figure 13:
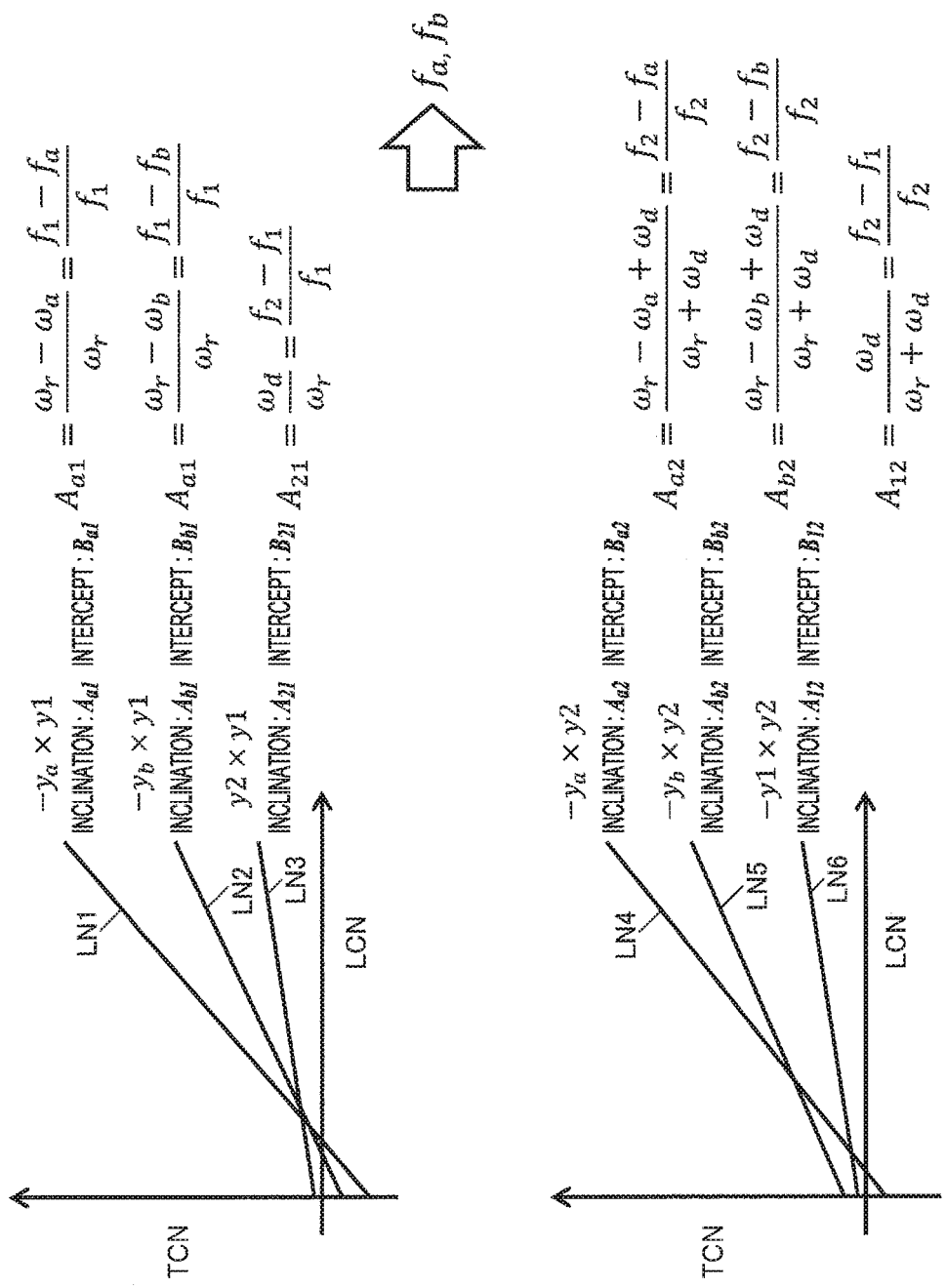
FIG. 13 is a detailed diagram illustrating a method of obtaining the inclination information.

Specifically, as illustrated in FIG. 13 which will be described later, the inclination Aa1 of the straight line LN1 in FIG. 4 can be indicated by Aa1=(ωr−ωa)/ωr, for example. The inclination Ab1 of the straight line LN2 can be indicated by Ab1=(ωr−ωb)/ωr, for example. Thus, the arithmetic circuit can obtain the pieces of frequency information (ωa and ωb) of the clock signals CR1 and CR2 based on the inclinations Aa1 and Ab1. The intercepts Ba1 and Bb1 of the straight lines LN1 and LN2 serve information indicating the phases of the clock signals CR1 and CR2 in A1 and A2 in FIG. 3. Thus, it is possible to obtain the first and second phase information (Ta and Tb) of the clock signals CR1 and CR2 by obtaining the intercept Ba1 between the straight line LN1 and the Y-axis and the intercept Bb1 between the straight line LN2 and the Y-axis.

As described above, according to the arithmetic method described in FIG. 4, it is possible to obtain the first and second frequency information and the first and second phase information of the clock signals CR1 and CR2 and to obtain the digital value DQ corresponding to the time difference TDF of the transition timing between the signals STA and STP, by the digital arithmetic processing using the clock count number based on the count value of the counter 42.

In the embodiment, the processing circuit 40 obtains the first time information (Ta) from the reference timing RTM in FIG. 3 until the transition timing of the signal STA and the second time information (Tb) from the reference timing RTM until the transition timing of the signal STP. The processing circuit obtains the digital value DQ corresponding to the time difference TDF of the transition timing between the signals STA and STP based on the first and second time information (Ta and Tb). According to this configuration, it is possible to realize time-digital conversion for the signals STA and STP by obtaining the first and second time information from the reference timing until the transition timings of the signals STA and STP.

Figure 5:
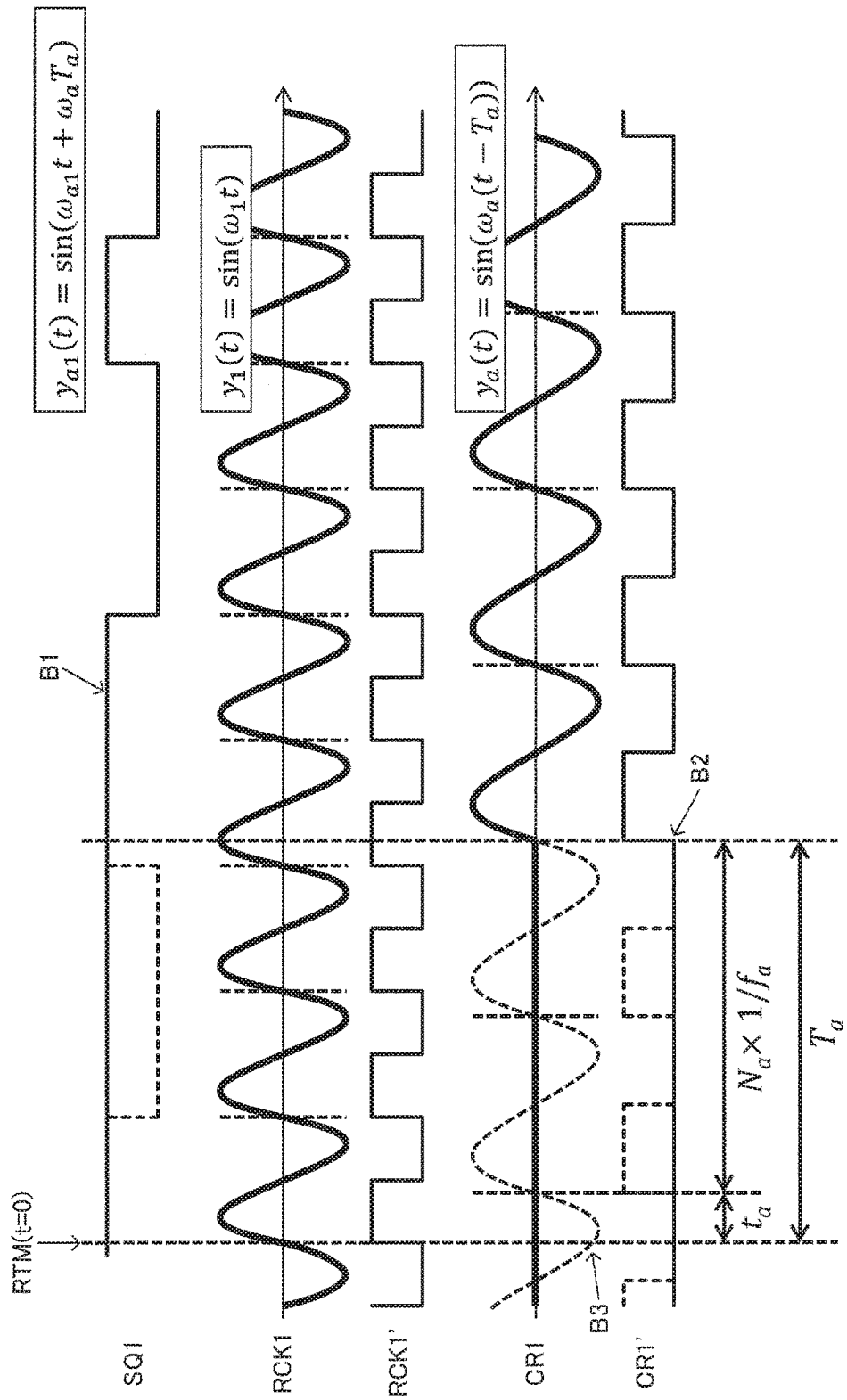
FIG. 5 is a diagram illustrating a method of obtaining phase information.

For example, in FIG. 5, B1 indicates a waveform of the output signal SQ1, which is practically observed. RCK1 indicates the reference clock signal. RCK1' indicates a square wave signal corresponding to reference clock signal RCK1. CR1 indicates the clock signal. CR1' indicates a square wave signal corresponding to the clock signal CR1. From the observed waveform indicated by B1 in FIG. 5, determination of whether or not a transition timing indicated by B2 is the transition timing of the signal STA in FIG. 3 is not possible, and recognition of only the phase of the clock signal CR1 at the reference timing RTM indicated by B3 is possible. Thus, the time (first time information) between the timing indicated by B2 and the timing indicated by B3 can be represented by Ta=ta+(Na/fa). Only a time indicated by ta can be obtained from the intercept Ba1 of the straight line LN1 in FIG. 4. Thus, it is necessary that Na indicating the wavenumber is separately obtained and Ta is calculated.

Figure 6:
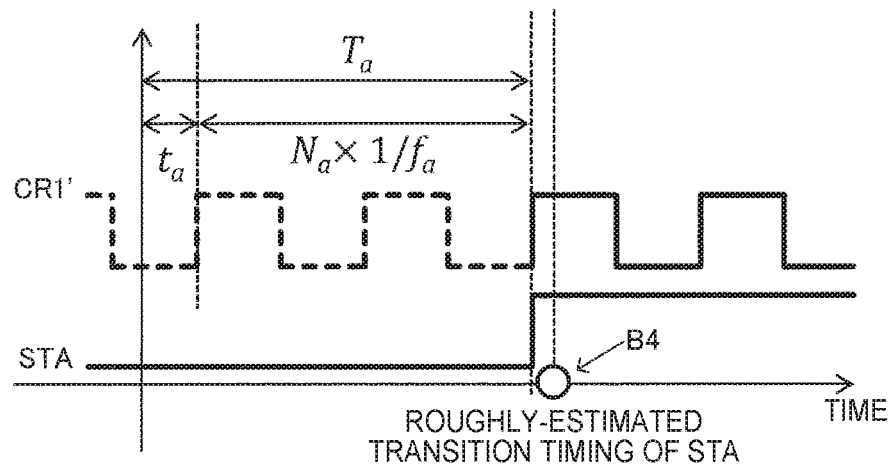
FIG. 6 is a diagram illustrating a method of obtaining a roughly-estimated transition timing of a signal.

As indicated by B4 in FIG. 6, the roughly-estimated transition timing of the signal STA is obtained. For example, an approximate transition timing of the signal STA is obtained by time-digital conversion having low accuracy. The processing circuit calculates accurate time information (Ta) for the signal STA based on the phase information (ta). Specifically, the processing circuit calculates the accurate time information (Ta) for the signal STA by calculating the wavenumber Na which is the closest to the roughly-estimated transition timing of the signal STA. For example, the processing circuit increments the wavenumber Na from 0 one by one, puts the wavenumber Na into the expression for time information, which is represented by ta+(Na/fa), and compares the value obtained by the putting to time information specified based on the roughly-estimated transition timing of the signal STA. Thus, the processing circuit obtains the wavenumber Na which is the closest to the roughly-estimated transition timing of the signal STA.

FIGS. 5 and 6 illustrate the method of calculating the time information (Ta) of the signal STA. The time information (Tb) of the signal STP can be calculated by the similar method. For example, in FIG. 5, only the phase of the clock signal CR2 at the reference timing RTM indicated by B3 can be recognized for the transition timing of the signal STP. The processing circuit obtains the roughly-estimated transition timing of the signal STP. For example, the processing circuit obtains an approximate transition timing of the signal STP by time-digital conversion having low accuracy. The processing circuit calculates the accurate time information (Tb) for the signal STP based on the phase information (tb). Specifically, the processing circuit calculates the accurate time information (Tb) for the signal STP by calculating the wavenumber Nb which is the closest to the roughly-estimated transition timing of the signal STP.

In the embodiment, ring oscillators can be used as the oscillation circuits 21 and 22 in FIG. 1. For example, a ring oscillator that starts the oscillation operation at the transition timing of the signal STA can be used as the oscillation circuit 21. A ring oscillator that starts the oscillation operation at the transition timing of the signal STP can be used as the oscillation circuit 22. The ring oscillator is an oscillation circuit in which a plurality (odd number) of delay elements (delay buffer circuits) are combined in a ring shape. For example, in a case where the signal STA is input as an enable signal of the ring oscillator constituting the oscillation circuit 21, and the signal STA as the enable signal is active (voltage level for indicating the active state), the oscillation operation of the ring oscillator is started. In a case where the signal STP is input as an enable signal of the ring oscillator constituting the oscillation circuit 22, and the signal STP as the enable signal is active, the oscillation operation of the ring oscillator is started. In this manner, it is possible to output the clock signals CR1 and CR2 having a signal waveform as illustrated in FIG. 3 from the oscillation circuits 21 and 22. In addition, it is possible to obtain the time difference TDF of the transition timing between the signals STA and STP by using the clock signals CR1 and CR2. The oscillation circuits 21 and 22 may be circuits which can start the oscillation operation in accordance with the signals STA and STP, and are not limited to the ring oscillators.

The frequency of the reference clock signal RCK1 is set as f1, the frequency of the clock signal CR1 is set as fa, and the frequency of the clock signal CR2 is set as fb. In this case, in the embodiment, the relational expressions of (f1/2)<fa<f1 and (f1/2)<fb<f1 are established.

For example, as illustrated in FIG. 1, the sampling circuits SP1 and SP2 perform sampling of the clock signals CR1 and CR2 by using the reference clock signal RCK1. Therefore, the frequency f1 of the reference clock signal RCK1 is required to be higher than the frequencies fa and fb of the clock signals CR1 and CR2, and the relational expressions of fa<f1 and fb<f1 are established. If the frequencies fa and fb of the clock signals CR1 and CR2 are smaller than the frequency corresponding to the half of the frequency f1 of the reference clock signal RCK1, for example, a signal having a frequency component which is higher than f1/2 is shown as the output signals SQ1 and SQ2 of the sampling circuits SP1 and SP2. For example, if f1 is 100 MHz, and fa is 40 MHz, a signal having a frequency component of 60 MHz is shown as the output signal SQ1. The above descriptions are similarly applied for the output signal SQ2. It is not possible to properly represent such a signal having a frequency component of 60 MHz, as a signal sampled at f1 (100 MHz), from the Nyquist theorem. Thus, the relational expressions of (f1/2)<fa and (f1/2)<fb are established. That is, the relational expressions of (f1/2)<fa<f1 and (f1/2)<fb<f1 are established.

2. Detailed Configuration Example

Figure 7:
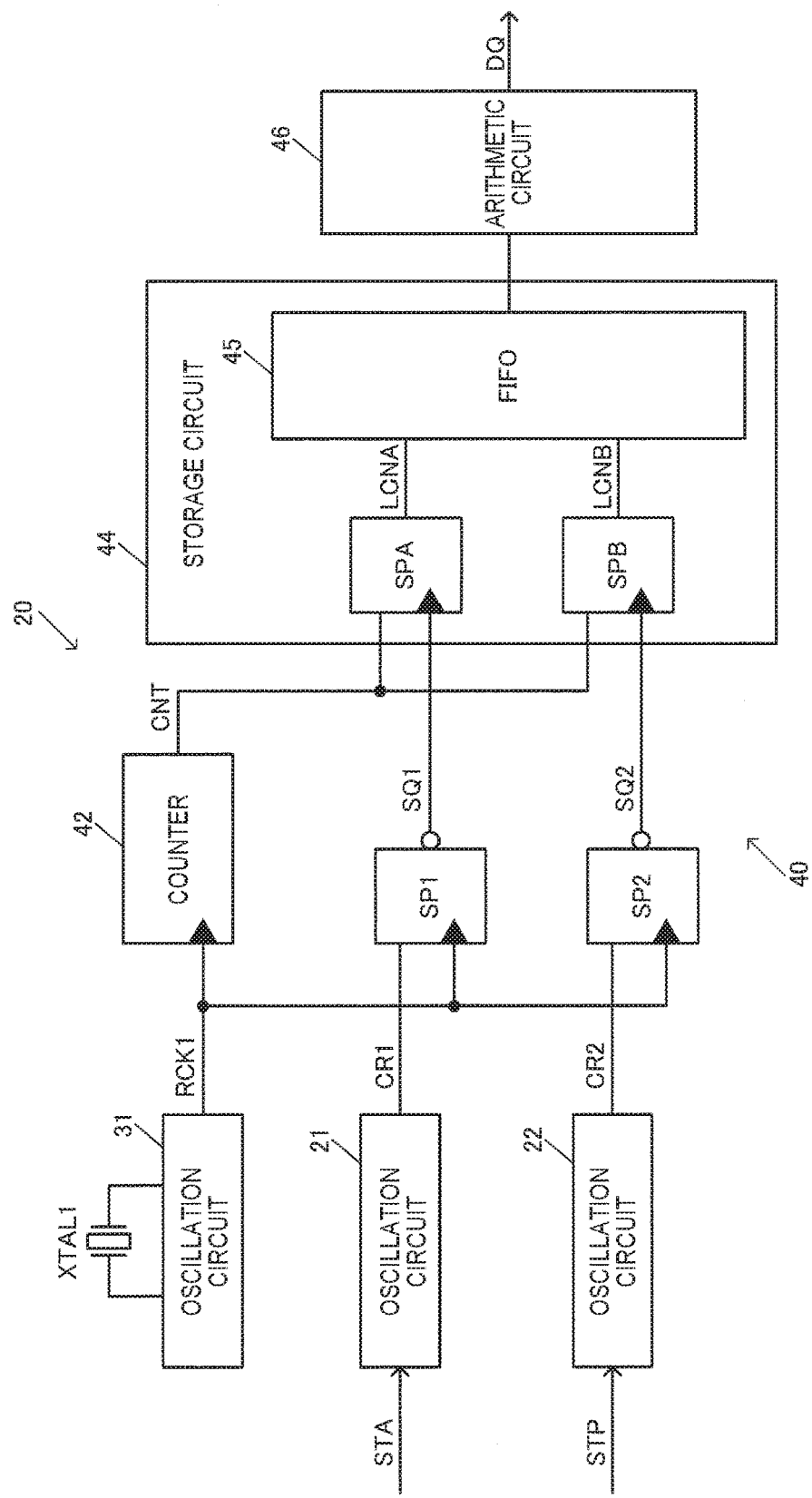
FIG. 7 illustrates a detailed configuration example of the time-to-digital converter in the embodiment.

FIG. 7 illustrates a detailed configuration example of the time-to-digital converter 20. As illustrated in FIG. 7, the processing circuit 40 includes the counter 42, the storage circuit 44, and the arithmetic circuit 46. The storage circuit 44 includes holding circuits SPA and SPB and a FIFO 45. The counter 42 performs the counting operation based on the reference clock signal RCK1, so as to output a count value CNT. The holding circuit (register) SPA of the storage circuit 44 fetches and holds the count value CNT of the counter 42 at a timing corresponding to the transition timing of the output signal SQ1 of the sampling circuit SP1, as a clock count number LCNA. The holding circuit (register) SPB of the storage circuit 44 fetches and holds the count value CNT of the counter 42 at a timing corresponding to the transition timing of the output signal SQ2 of the sampling circuit SP2, as a clock count number LCNB. The clock count numbers LCNA and LCNB correspond to the clock count number LCN which is the value on the X-axis in FIG. 4.

The FIFO 45 stores the clock count numbers LCNA and LCNB fetched in the holding circuits SPA and SPB, in a FIFO manner. The arithmetic circuit 46 performs the arithmetic processing described in, for example, FIGS. 4 to 6, based on information of the clock count numbers LCNA and LCNB (clock cycle number) stored in the FIFO 45, and obtains the digital value DQ corresponding to the time difference TDF of the transition timing between the signals STA and STP.

Figure 8:
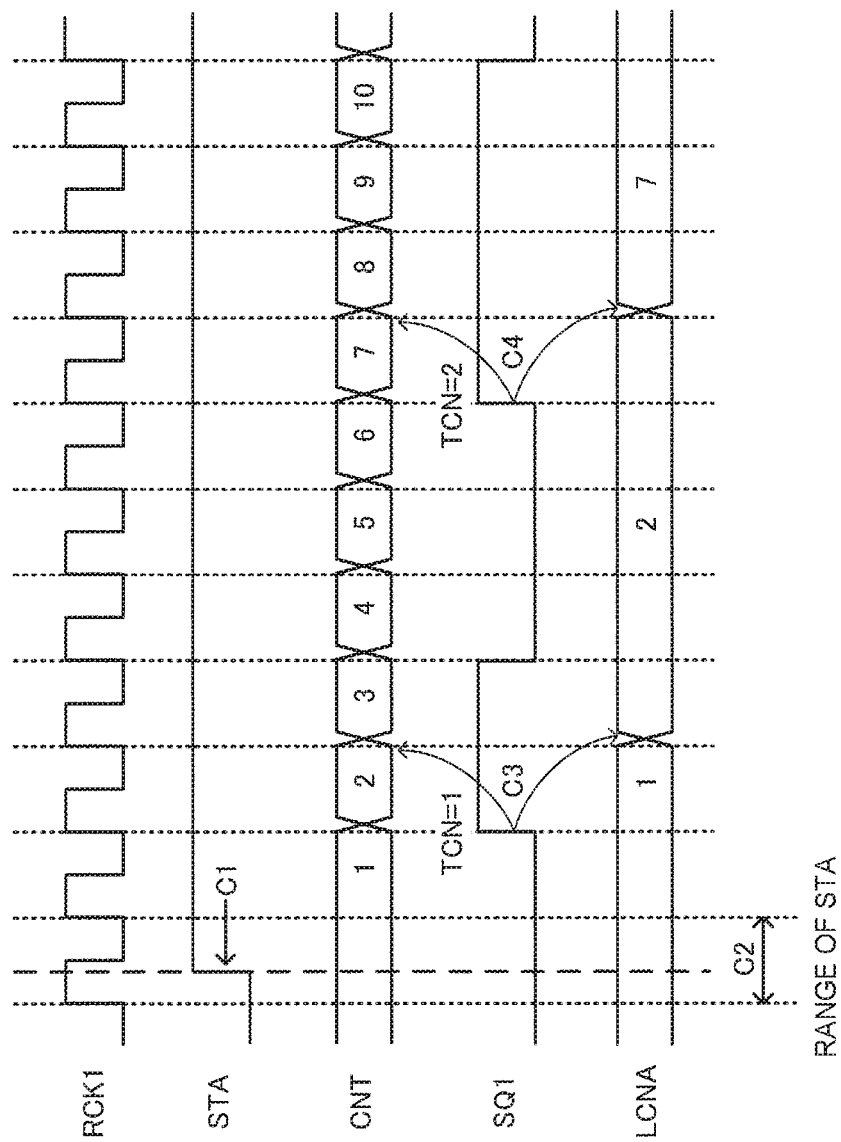
FIG. 8 illustrates a signal waveform example for describing an operation of the detailed configuration example.

FIG. 8 illustrates a signal waveform example for describing an operation of the configuration example in FIG. 7. The signal STA changes from an L level (inactive state) to an H level (active state) at C1 in FIG. 8. The signal STA transitions in a range indicated by C2. If the signal STA has the H level, the counting operation of the counter 42 starts and the count value CNT increments, so as to be 1, 2, 3, 4, . . . , for example. As indicated by C3 in FIG. 8, if the output signal SQ1 transitions from the L level to the H level, the count value CNT (=2) at a timing corresponding to the transition timing is fetched in the storage circuit 44 (holding circuit SPA), in a form of clock count number LCNA which is 2. Similarly, as indicated by C4 in FIG. 8, if the output signal SQ1 transitions from the L level to the H level, the count value CNT (=7) at a timing corresponding to the transition timing is fetched in the storage circuit 44, in a form of clock count number LCNA which is 7. The arithmetic circuit 46 performs the arithmetic processing described in, for example, FIGS. 4 to 6, based on the clock count number LCNA fetched in the storage circuit 44 in this manner, so as to obtain the digital value DQ corresponding to the time difference TDF.

For example, the value of the point indicated by the triangle mark on the straight line LN1 in FIG. 4, on the X-axis (first coordinate axis), serves the clock count number LCNA fetched in the storage circuit 44. In this case, the value thereof on the Y-axis (second coordinate axis) serves as the transition count value TCN of the output signal SQ1 of the sampling circuit SP1. For example, TCN increments for each transition of the output signal SQ1 (for each rising edge thereof) such that the transition count value TCN at C3 in FIG. 8 is 1 and the transition count value TCN at C4 is 2.

The arithmetic circuit 46 obtains the fitting straight line (LN1) of the plurality of points (triangle marks) at which the coordinate values are obtained in this manner, by the least-square method, so as to obtain the inclination information (Aa1) and the intercept information (Ba1). The arithmetic circuit obtains the frequency information (ωa) and the phase information (Ta) of the clock signal CR1 based on the inclination information and the intercept information.

Figure 9:
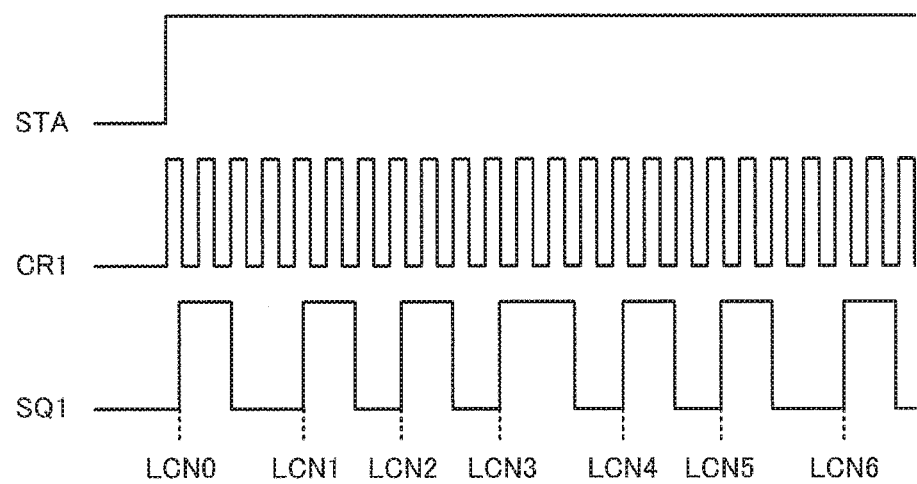
FIG. 9 illustrates a signal waveform example for describing the operation of the detailed configuration example.

FIG. 9 illustrates a specific example of signal waveforms of the signal STA, the clock signal CR1, and the output signal SQ1. If the signal STA changes from the L level to the H level, the oscillation circuit 21 starts the oscillation operation so as to output the clock signal CR1. The sampling circuit SP1 performs sampling of the clock signal CR1 by using the reference clock signal RCK1 (not illustrated). In a case where the frequencies of the reference clock signal RCK1 and the clock signal CR1 are set as f1 and fa, as described above, the relational expression of (f1/2)<fa<f1 is established. For example, in a case where the frequency f1 of the reference clock signal RCK1 is set to 100 MHz, the frequency fa of the clock signal CR1 can be set to be about 80 MHz. The output signal SQ1 as illustrated in FIG. 9 is output from the sampling circuit SP1 by performing sampling of the clock signal CR1 having such a frequency fa by the reference clock signal RCK1 having a frequency f1. The output signal SQ1 has a signal waveform which is approximate to the sine wave in Expression (6). The count value CNT of the counter 42 is fetched in the holding circuit SPA at the transition timing of the output signal SQ1, and clock count numbers LCN0, LCN1, LCN2, LCN3, and . . . corresponding to fetched count values CNT are stored in the FIFO 45. The clock count numbers LCN0, LCN1, LCN2, LCN3, and . . . are values of the points indicated by the triangle marks on the straight line LN1 in FIG. 4, on the X-axis. The transition count value TCN incrementing for each transition of the output signal SQ1 is the value of the point indicated by the triangle mark in FIG. 4, on the Y-axis. The fitting straight line (LN1) of the plurality of points is obtained, and the inclination information (Aa1) and the intercept information (Ba1) are obtained.

For example, if the frequency fa of the clock signal CR1 is high, a period between the transition timings of the output signal SQ1 (for example, between the rising edges thereof) is reduced. Thus, the clock count numbers LCN0, LCN1, LCN2, and . . . are reduced. Thus, the inclination Aa1 of the straight line LN1 in FIG. 4 increases. If the frequency fa of the clock signal CR1 is low, the period between the transition timings of the output signal SQ1 becomes longer. Thus, the clock count numbers LCN0, LCN1, LCN2, and . . . increase. Thus, the inclination Aa1 of the straight line LN1 in FIG. 4 is reduced. That is, the inclination Aa1 changes depending on the frequency fa of the clock signal CR1.

FIGS. 8 and 9 illustrate the example of the method of the arithmetic processing for the signal STA. Arithmetic processing for the signal STP is realized by the similar method. For example, in FIG. 8, the count value CNT of the counter 42 at a timing corresponding to the transition timing of the output signal SQ2 of the sampling circuit SP2 is fetched in the storage circuit 44, as the clock count number LCNB. The value of the point indicated by the triangle mark on the straight line LN2 in FIG. 4, on the X-axis serves as the clock count number LCNB fetched in the storage circuit 44. In this case, the value thereof on the Y-axis serves the transition count value TCN of the output signal SQ2 of the sampling circuit SP2.

In FIG. 9, sampling of the clock signal CR2 obtained by starting the oscillation operation by the signal STP is performed by the reference clock signal RCK1, and thus the output signal SQ2 is output from the sampling circuit SP2. The output signal SQ2 has a signal waveform which is approximate to the sine wave in Expression (7). The count value CNT of the counter 42 is fetched in the holding circuit SPB at the transition timing of the output signal SQ2, and clock count numbers LCN0, LCN1, LCN2, LCN3, and . . . corresponding to fetched count values CNT are stored in the FIFO 45. The clock count numbers LCN0, LCN1, LCN2, LCN3, and . . . are values of the points indicated by the triangle marks on the straight line LN2 in FIG. 4, on the X-axis. The transition count value TCN incrementing for each transition of the output signal SQ2 is the value of the point indicated by the triangle mark, on the Y-axis. The fitting straight line (LN2) of the plurality of points is obtained, and the inclination information (Ab1) and the intercept information (Bb1) are obtained.

In FIGS. 8 and 9, the count values CNT themselves at the timings corresponding to the transition timings of the clock signals CR1 and CR2 are used as the clock count number information. However, the embodiment is not limited thereto. For example, a difference value of the count value, for example, LCN1-LCN0, LCN2-LCN1, and LCN3-LCN2, may be stored in the FIFO as the clock count number information. With this configuration, it is possible to save the used storage capacity and the like of the FIFO 45.

3. Second Configuration Example

Figure 10:
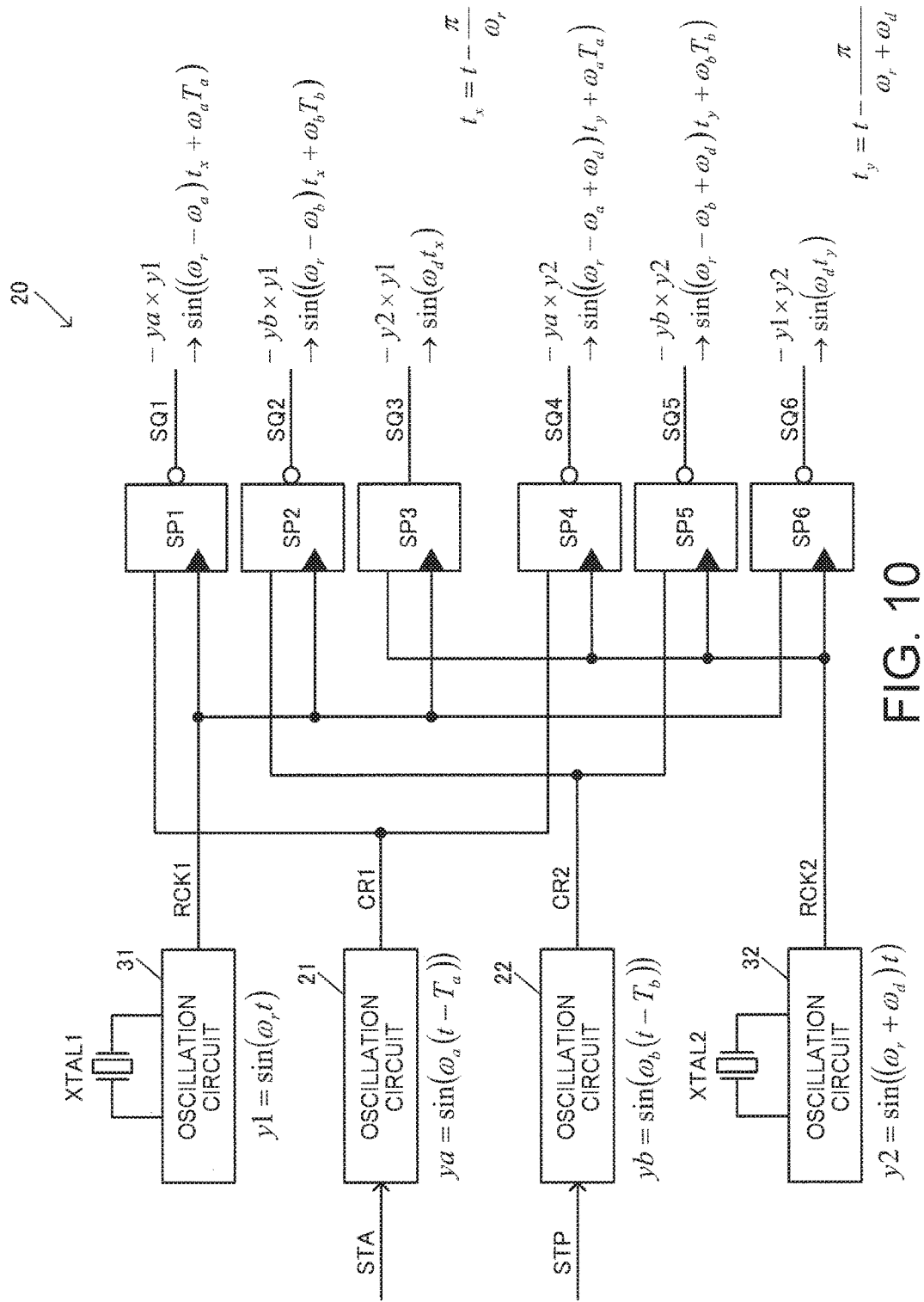
FIG. 10 illustrates a second configuration example of the time-to-digital converter in the embodiment.

FIG. 10 illustrates a second configuration example of the time-to-digital converter 20 in the embodiment. The time-to-digital converter 20 in the second configuration example includes sampling circuits SP3, SP4, SP5, and SP6 (third to sixth sampling circuits) in addition to the oscillation circuits 21 and 22 and the sampling circuits SP1 and SP2 in FIG. 1. An oscillation circuit 32 that generates a reference clock signal (second reference clock signal) RCK2 is provided in addition to the oscillation circuit 31 that generates the reference clock signal RCK1. The oscillation circuit 32 generates the reference clock signal RCK2 by an oscillation operation using an oscillator XTAL2. The oscillator XTAL2 is realized by an oscillator similar to XTAL1. For example, the oscillator XTAL2 is realized by a resonator element such as a quartz crystal resonator element.

Similar to the configuration example in FIG. 1, the sampling circuits (first and second sampling circuits) SP1 and SP2 perform sampling of the clock signals CR1 and CR2 by the reference clock signal RCK1 so as to output the output signals SQ1 and SQ2, respectively.

The sampling circuit (third sampling circuit, third mixer circuit) SP3 performs sampling of the reference clock signal (second reference clock signal) RCK2 by the reference clock signal (first reference clock signal) RCK1, so as to output an output signal (third output signal) SQ3. The sampling circuit (fourth sampling circuit) SP4 performs sampling of the clock signal CR1 by the reference clock signal RCK2 so as to output an output signal (fourth output signal) SQ4. The sampling circuit (fifth sampling circuit) SP5 performs sampling of the clock signal CR2 by the reference clock signal RCK2 so as to output an output signal (fifth output signal) SQ5. The sampling circuit (sixth sampling circuit) SP6 performs sampling of the reference clock signal RCK1 by the reference clock signal RCK2 so as to output an output signal (sixth output signal) SQ6. Operations and the configurations of the sampling circuit SP3 to SP6 are similar to those of the sampling circuits SP1 and SP2, and detailed descriptions thereof will not be repeated.

The processing circuit 40 obtains the first frequency information ($\omega a$) and the first phase information (Ta) of the clock signal CR1 and the second frequency information ($\omega b$) and the second phase information (Tb) of the clock signal CR2 based on the output signals SQ1 to SQ6 of the sampling circuits SP1 to SP6. For example, the processing circuit can obtain the first frequency information ($\omega a$) and the first phase information (Ta) of the clock signal CR1 based on the output signal SQ1 of the sampling circuit SP1 and the output signal SQ4 of the sampling circuit SP4. The processing circuit can obtain the second frequency information ($\omega b$) and the second phase information (Tb) of the clock signal CR2 based on the output signal SQ2 of the sampling circuit SP2 and the output signal SQ5 of the sampling circuit SP5.

For example, the reference clock signal RCK1 of the oscillation circuit 31, the reference clock signal RCK2 of the oscillation circuit 32, and the clock signals CR1 and CR2 of the oscillation circuits 21 and 22 can be represented by sinusoidal expressions such as Expressions (10) to (13).

$$y1=\sin(\omega_r t) \quad (10)$$

$$y2=\sin((\omega_r+\omega_d)t+\theta) \quad (11)$$

$$ya=\sin(\omega_a(t-T_a)) \quad (12)$$

$$yb=\sin(\omega_b(t-T_b)) \quad (13)$$

$$\omega_a,\omega_b<\omega_1<\omega_2\omega_1=\omega_r,\omega_2=\omega_r+\varphi_d \quad (14)$$

$\omega 1$ (=$\omega r$), $\omega 2$ (=$\omega r+\omega d$), $\omega a$, and $\omega b$ indicate angular frequencies corresponding to the clock frequencies of RCK1, RCK2, CR1, and CR2, respectively. For example, regarding $\omega 1$, $\omega 2$, $\omega a$, and $\omega b$, the relational expression as represented by Expression (14) is established. Ta and Tb indicate information indicating the phases of the clock signals CR1 and CR2.

The output signals SQ1 to SQ6 of the sampling circuits SP1 to SP6 can be approximately represented as in Expressions (15) to (20). That is, the output signals SQ1 to SQ6 include information represented by Expressions (15) to (20).

$$-ya \times y1 \rightarrow \sin((\omega_r-\omega_a)t_x+\omega_a T_a) \quad (15)$$

$$-yb \times y1 \rightarrow \sin((\omega_r-\omega_b)t_x+\omega_b T_b) \quad (16)$$

$$-y2 \times y1 \rightarrow \sin(\omega_d t_x) \quad (17)$$

$$-ya \times y2 \rightarrow \sin((\omega_r-\omega_a+\omega_d)t_y+\omega_a T_a) \quad (18)$$

$$-yb \times y2 \rightarrow \sin((\omega_r-\omega_b+\omega_d)t_y+\omega_b T_b) \quad (19)$$

$$-y1 \times y2 \rightarrow \sin(\omega_d t_y) \quad (20)$$

Here, tx and ty are defined as with Expressions (21) and (22).

$$t_x = t - \frac{\pi}{\omega_r} \quad (21)$$

$$t_y = t - \frac{\pi}{\omega_r + \omega_d} \quad (22)$$

The processing circuit 40 obtains the first frequency information ($\omega a$) and the first phase information (Ta) of the clock signal CR1 and the second frequency information ($\omega b$) and the second phase information (Tb) of the clock signal CR2 based on the output signals SQ1 to SQ6 of the sampling circuits SP1 to SP6. The processing circuit 40 obtains the digital value DQ corresponding to the time difference of the transition timing between the signals STA and STP based on the first and second frequency information and first and second phase information (ωa, ωb, Ta, and Tb) of the clock signals CR1 and CR2.

Figure 11:
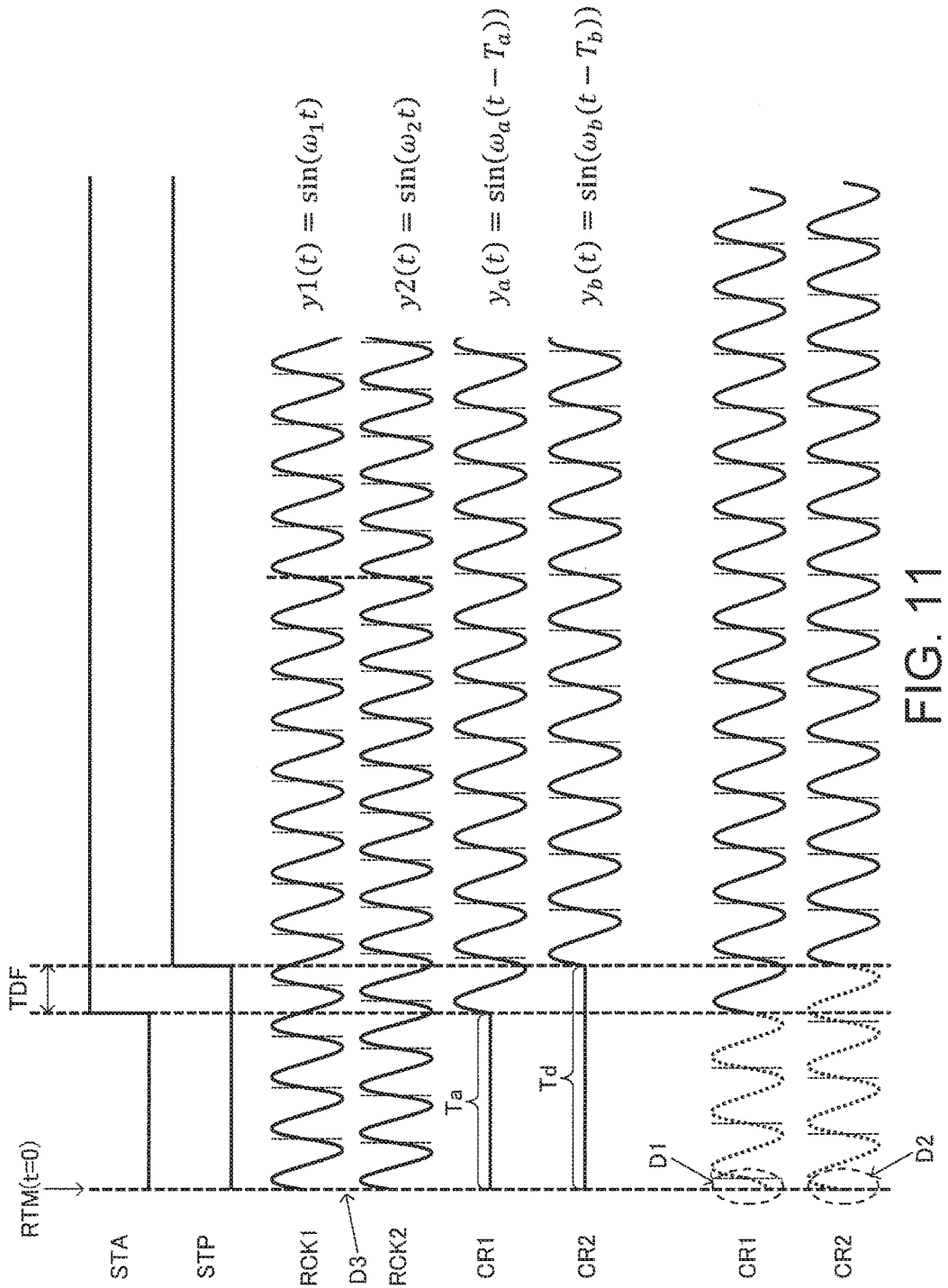
FIG. 11 illustrates a signal waveform example for describing an operation of the second configuration example.

FIG. 11 illustrates a signal waveform example for describing an operation of the time-to-digital converter 20 in the second configuration example. The processing circuit 40 obtains the time difference TDF by performing the arithmetic processing of obtaining the phase information Ta and Tb of the clock signals CR1 and CR2. Only information of the phases of the clock signals CR1 and CR2 in the vicinity of the reference timing RTM (t=0), which is indicated by D1 and D2 is practically obtained by the processing circuit 40 through the arithmetic processing. In FIG. 11, the reference timing RTM is a timing at which the phases of the reference clock signals RCK1 and RCK2 are synchronized (coincide) with each other, as indicated by D3.

For example, the processing circuit 40 obtains the first time information (Ta) from the reference timing RTM as the phase synchronization timing between the reference clock signals RCK1 and RCK2, until the transition timing of the signal STA. The processing circuit obtains the second time information (Tb) from the reference timing RTM until the transition timing of the signal STP. The processing circuit obtains the digital value DQ corresponding to the time difference TDF of the transition timing between the signals STA and STP, based on the first and second time information (Ta and Tb).

According to this configuration, it is possible to obtain the first and second time information (Ta and Tb) for the signals STA and STP by using the phase synchronization timing between the reference clock signals RCK1 and RCK2, as the reference timing RTM. For example, it is possible to realize time-digital conversion in which the phase synchronization timing between the reference clock signals RCK1 and RCK2 is detected as the reference timing RTM so as to obtain the first and second time information, and the digital value DQ corresponding to the time difference TDF is obtained.

As described above, according to the second configuration example in FIG. 10, the two reference clock signals RCK1 and RCK2 are used. In addition, the frequency information (ωa and ωb) and the phase information (Ta and Tb) of the clock signals CR1 and CR2 are obtained by using the output signals SQ1 to SQ6 of the six sampling circuits SP1 to SP6. Time-digital conversion of obtaining the digital value DQ corresponding to the time difference TDF of the transition timing between the signals STA and STP is performed. Thus, it is possible to improve the performance of time-digital conversion in comparison to the configuration of using the one reference clock signal RCK1 and the output signals SQ1 and SQ2 of the two sampling circuits SP1 and SP2 as in FIG. 1. For example, it is possible to obtain the frequency information or the phase information of the clock signals CR1 and CR2 with high accuracy. Thus, it is also possible to obtain the digital value DQ corresponding to the time difference TDF, with high accuracy.

The time-to-digital converter 20 in the embodiment is not limited to the configuration illustrated in FIGS. 1, 10, and the like, and various modifications can be made. For example, three oscillators or more may be prepared and the sampling operation of the sampling circuit may be performed by using three reference signals or more.

Next, details of the arithmetic processing of the processing circuit 40 in the second configuration example will be described with reference to FIGS. 12 to 14.

Figure 12:
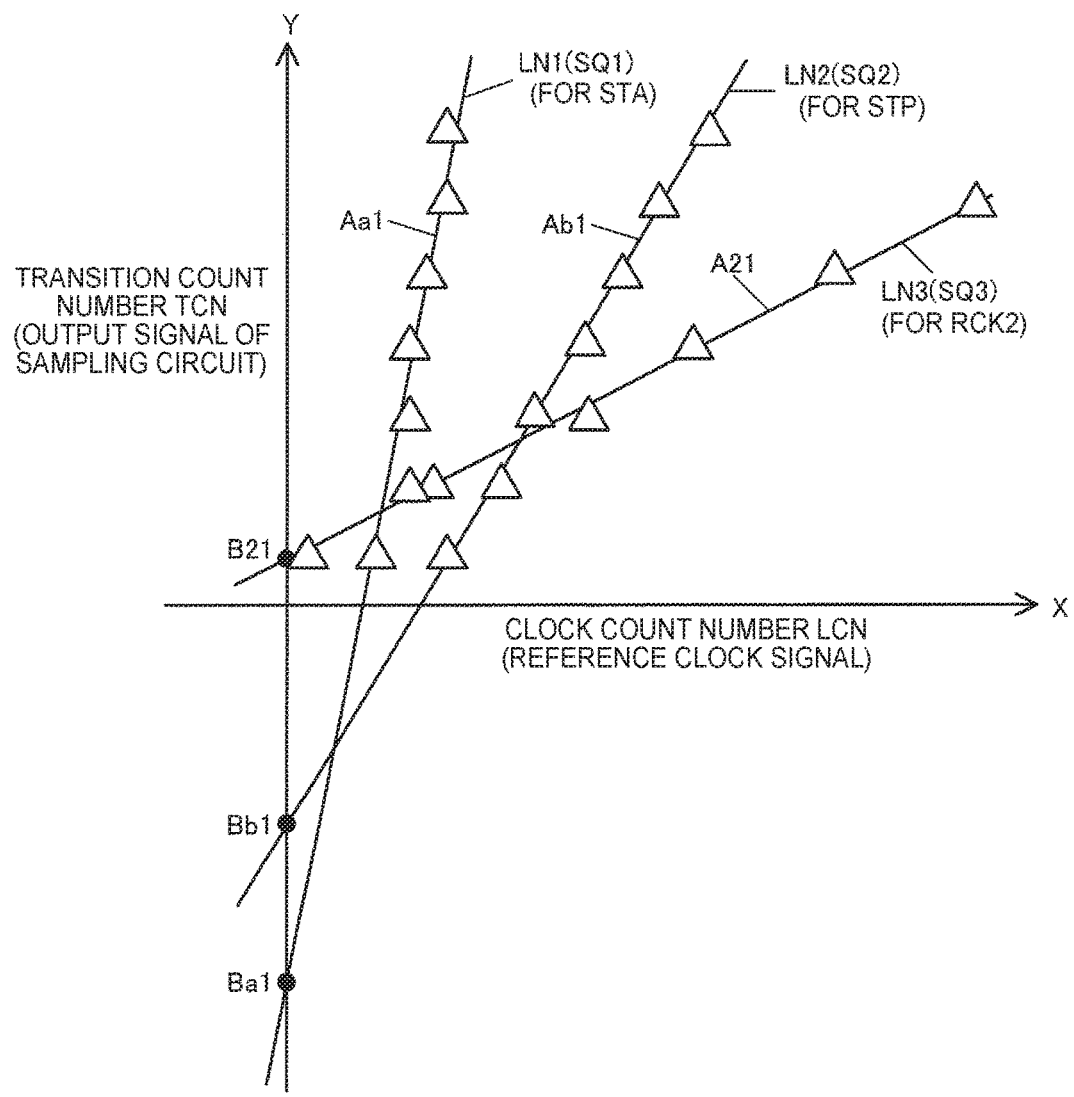
FIG. 12 is a diagram illustrating a method of obtaining the inclination information and the intercept information.

FIGS. 12 and 13 are diagrams corresponding to FIG. 4 described above. In FIGS. 12 and 13, the arithmetic circuit 46 specifies the straight line LN1 and obtains the inclination Aa1 and the intercept Ba1 of the straight line LN1, based on the plurality of points in which the value on the X-axis indicates the clock count number LCN based on the count value CNT at the transition timing of the output signal SQ1, and the value on the Y-axis indicates the transition count value TCN of the output signal SQ1. The arithmetic circuit specifies the straight line LN2 and obtains the inclination Ab1 and the intercept Bb1 of the straight line LN2, based on the plurality of points in which the value on the X-axis indicates the clock count number LCN based on the count value CNT at the transition timing of the output signal SQ2, and the value on the Y-axis indicates the transition count value TCN of the output signal SQ2. For example, the arithmetic circuit specifies a straight line LN3 and obtains the inclination A21 and the intercept B21 of the straight line LN3, based on a plurality of points in which the value on the X-axis indicates the count number of the reference clock signal RCK1, and the value on the Y-axis indicates the count number of the reference clock signal RCK2.

The arithmetic circuit 46 specifies a straight line LN4 and obtains the inclination Aa2 and the intercept Ba2 of the straight line LN4, based on a plurality of points in which the value on the X-axis indicates the clock count number LCN based on the count value CNT at the transition timing of the output signal SQ4, and the value on the Y-axis indicates the transition count value TCN of the output signal SQ4. The arithmetic circuit specifies a straight line LN5 and obtains the inclination Ab2 and the intercept Bb2 of the straight line LN5, based on a plurality of points in which the value on the X-axis indicates the clock count number LCN based on the count value CNT at the transition timing of the output signal SQ5, and the value on the Y-axis indicates the transition count value TCN of the output signal SQ5. For example, the arithmetic circuit specifies a straight line LN6 and obtains the inclination A12 and the intercept B12 of the straight line LN6, based on a plurality of points in which the value on the X-axis indicates the count number of the reference clock signal RCK2, and the value on the Y-axis indicates the count number of the reference clock signal RCK1.

The arithmetic circuit 46 obtains the first and second frequency information (ωa and ωb) and the first and second phase information (Ta and Tb) of the clock signals CR1 and CR2 based on the pieces of information of the inclinations Aa1, Ab1, A21, Aa2, Ab2, and A12, and the intercepts Ba1, Bb1, B21, Ba2, Bb2, and B12, and obtains the digital value DQ corresponding to the time difference TDF.

The inclinations Aa1, Ab1, A21, Aa2, Ab2, and A12 can be represented as in Expressions (23) to (28).

$$A_{a1} = \frac{\omega_r - \omega_a}{\omega_r} = \frac{f_1 - f_a}{f_1} \qquad (23)$$

$$A_{a1} = \frac{\omega_r - \omega_b}{\omega_r} = \frac{f_1 - f_b}{f_1} \qquad (24)$$

$$A_{21} = \frac{\omega_d}{\omega_r} = \frac{f_2 - f_1}{f_1} \qquad (25)$$

$$A_{a2} = \frac{\omega_r - \omega_a + \omega_d}{\omega_r + \omega_d} = \frac{f_2 - f_a}{f_2} \qquad (26)$$

$$A_{a2} = \frac{\omega_r - \omega_b + \omega_d}{\omega_r + \omega_d} = \frac{f_2 - f_b}{f_2} \qquad (27)$$

$$A_{12} = \frac{\omega_d}{\omega_r + \omega_d} = \frac{f_2 - f_1}{f_2} \quad (28)$$

The arithmetic circuit 46 obtains the frequencies fa and fb of the clock signals CR1 and CR2 based on Expressions (23) to (28). For example, in a case where the frequencies f1 and f2 are known, it is possible to easily obtain the frequencies fa and fb based on Expressions (23) to (28). For example, the arithmetic circuit performs averaging processing of the frequencies fa and fb obtained from Expressions (23) to (25) and the frequencies fa and fb obtained from Expressions (26) to (28), and thus it is possible to obtain the frequencies fa and fb with higher accuracy.

In the embodiment, the processing circuit 40 performs correction processing based on the output signal SQ3 of the sampling circuit SP3 and the output signal SQ6 of the sampling circuit SP6, and thus obtains the first and second frequency information (ωa and ωb) and the first and second phase information (Ta and Tb). Specifically, the processing circuit performs correction processing such as commonization between axes as illustrated in FIG. 14. For example, the X-axis indicates the clock count number LCN of the reference clock signal RCK1 in a coordinate system indicated by E1 in FIG. 14, but the X-axis indicates the clock count number LCN of the reference clock signal RCK2 in a coordination system indicated by E2. Thus, the X-axes are not the common time axes in the same scale. Therefore, the processing circuit performs correction processing for obtaining the common time axes.

Figure 14:
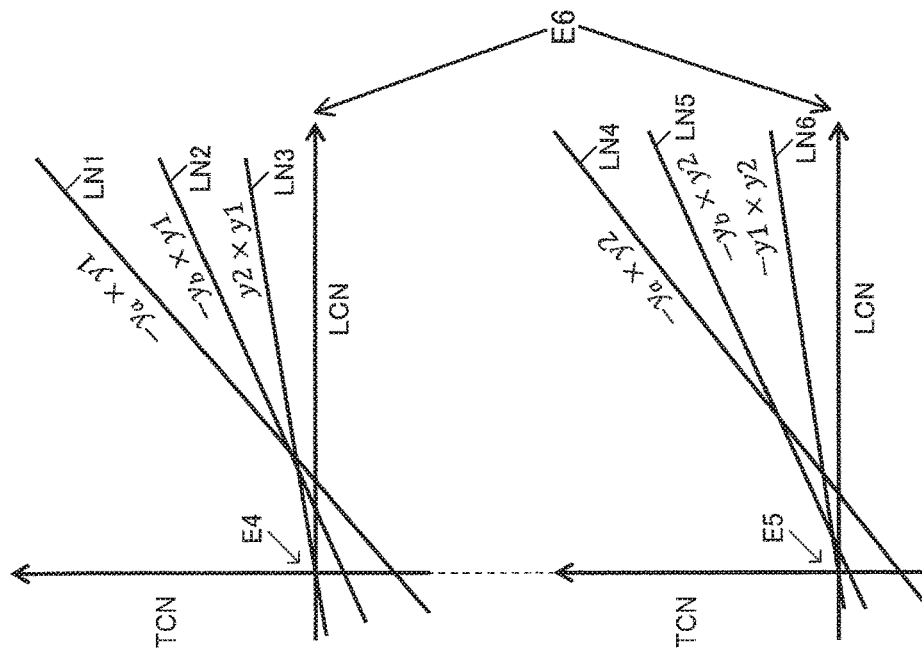
FIG. 14 is a diagram illustrating correction processing for commonization between axes.
Figure 14:
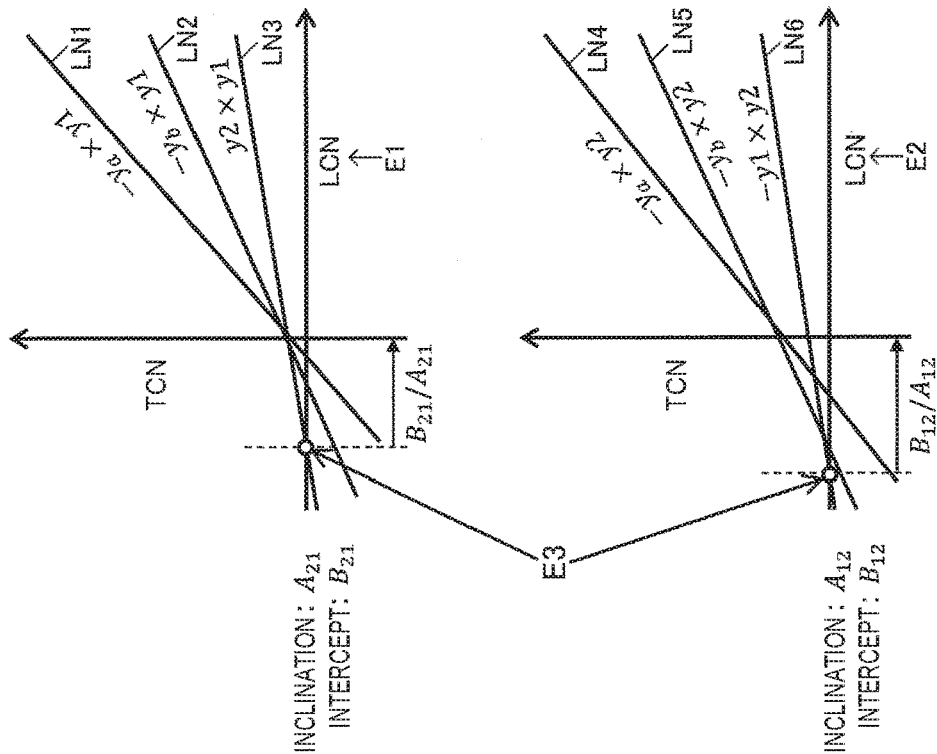

Specifically, as indicated by E3 in FIG. 14, a point at which a straight line LN3 which satisfies y2xy1 and corresponds to the output signal SQ3 of the sampling circuit SP3 intersects the X-axis coincides with a point at which a straight line LN6 which satisfies -y1xy2 and corresponds to the output signal SQ6 of the sampling circuit SP6 intersects the X-axis. That is, it is considered that the phases at the points are equal to each other, and the times at the points are the same as each other. As indicated by D3 in FIG. 11, the points correspond to the phase synchronization timings of the reference clock signals RCK1 and RCK2. As indicated by E4 and E5, correction is performed such that the point indicated by E3 becomes the origin of the coordinate system. At E6, the processing circuit multiplies the clock count number LCN by the cycles of the reference clock signals RCK1 and RCK2, so as to realize the correction processing of causing the X-axis to become the common time axis. Thus, it is possible to realize suitable arithmetic processing of the first and second frequency information (ωa and ωb) and the first and second phase information (Ta and Tb) of the clock signals CR1 and CR2 by using the pieces of information of the inclinations Aa1, Ab1, A21, Aa2, Ab2, and A12, and the intercepts Ba1, Bb1, B21, Ba2, Bb2, and B12.

Specifically, as shown in Expressions (29) to (32), the processing circuit obtains to and tb and obtains Ta and Tb, by performing processing of extracting only decimal parts of intercepts B'a1, B'a2, B'b1, and B'b2. The intercepts B'a1, B'a2, B'b1, and B'b2 are obtained by the correction processing for the time axis.

$$B'_{a1} \xrightarrow[\text{decimal part}]{\text{Extract only}} t_a = \frac{B'_{a1}}{f_a} \quad (29)$$

$$B'_{a2} \xrightarrow[\text{decimal part}]{\text{Extract only}} t_a = \frac{B'_{a2}}{f_a} \quad (30)$$

$$B'_{b1} \xrightarrow[\text{decimal part}]{\text{Extract only}} t_b = \frac{B'_{b1}}{f_b} \quad (31)$$

$$B'_{b2} \xrightarrow[\text{decimal part}]{\text{Extract only}} t_b = \frac{B'_{b2}}{f_b} \quad (32)$$

In the embodiment, in a case where the frequencies of the reference clock signals RCK1 and RCK2 are set to f1 and f2, and the frequencies of the clock signals CR1 and CR2 are set to fa and fb, the frequencies f1 and f2 are different from each other, and the relational expressions of (f1/2)<fa<f1, (f1/2)<fb<f1, (f2/2)<fa<f2, and (f2/2)<fb<f2 are established. For example, the sampling circuits SP1 and SP2 perform sampling of the clock signals CR1 and CR2 by using the reference clock signal RCK1. The sampling circuits SP4 and SP5 perform sampling of the clock signals CR1 and CR2 by using the reference clock signal RCK2. Therefore, it is necessary that the frequency f1 of the reference clock signal RCK1 is higher than the frequencies fa and fb of the clock signals CR1 and CR2. It is necessary that the frequency f2 of the reference clock signal RCK2 is higher than the frequencies fa and fb of the clock signals CR1 and CR2. Therefore, the relational expressions of fa<f1, fb<f1, fa<f2, and fb<f2 are established.

If the frequencies fa and fb of the clock signals CR1 and CR2 are smaller than a frequency corresponding to ½ of the frequency f1 of the reference clock signal RCK1, for example, a signal having a frequency component higher than f1/2 is shown as the output signals SQ1 and SQ2 of the sampling circuits SP1 and SP2, and occurring a situation in which the signal having the frequency component is properly shown as a signal subjected to sampling at the frequency f1 is not possible. If the frequencies fa and fb of the clock signals CR1 and CR2 are smaller than a frequency corresponding to ½ of the frequency f2 of the reference clock signal RCK2, for example, a signal having a frequency component higher than f2/2 is shown as the output signals SQ4 and SQ5 of the sampling circuits SP4 and SP5, and occurring a situation in which the signal having the frequency component is properly shown as a signal subjected to sampling at the frequency f2 is not possible. Thus, the relational expressions of (f1/2)<fa, (f1/2)<fb, (f2/2)<fa, and (f2/2)<fb are established. That is, the relational expressions of (f1/2)<fa<f1, (f1/2)<fb<f1, (f2/2)<fa<f2, and (f2/2)<fb<f2 are established.

4. Circuit Device and Physical Quantity Measuring Device

Figure 15:
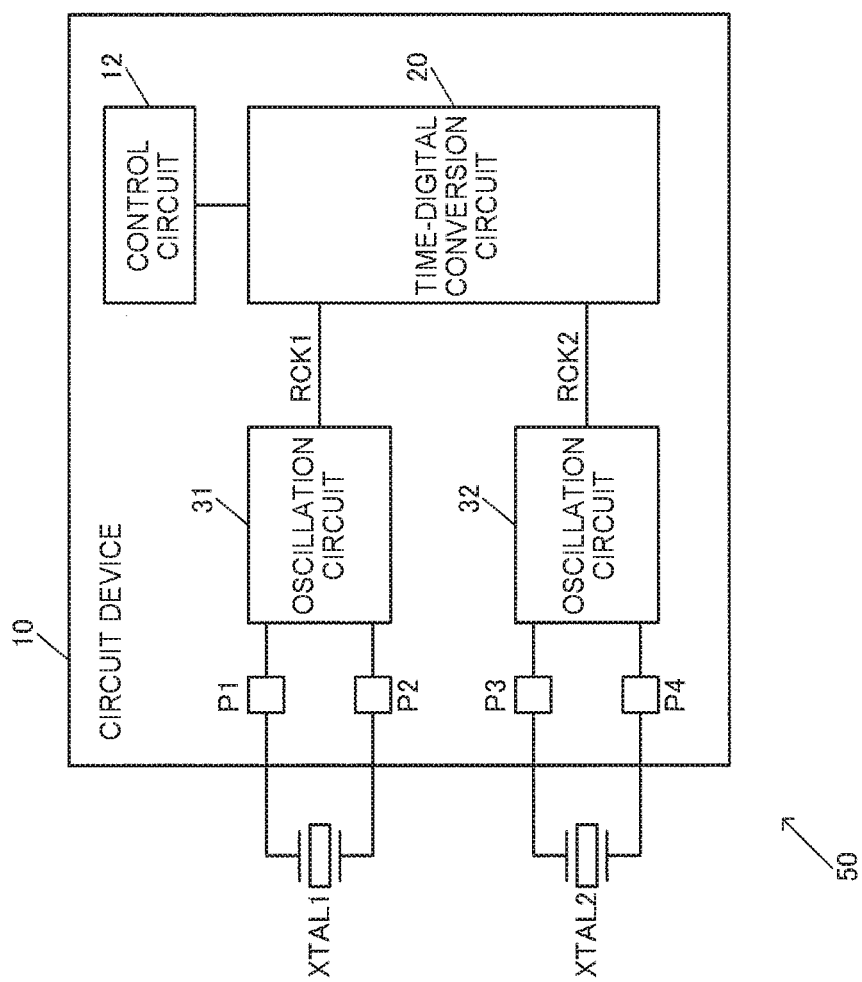
FIG. 15 illustrates a configuration example of a circuit device in the embodiment.
Figure 16:
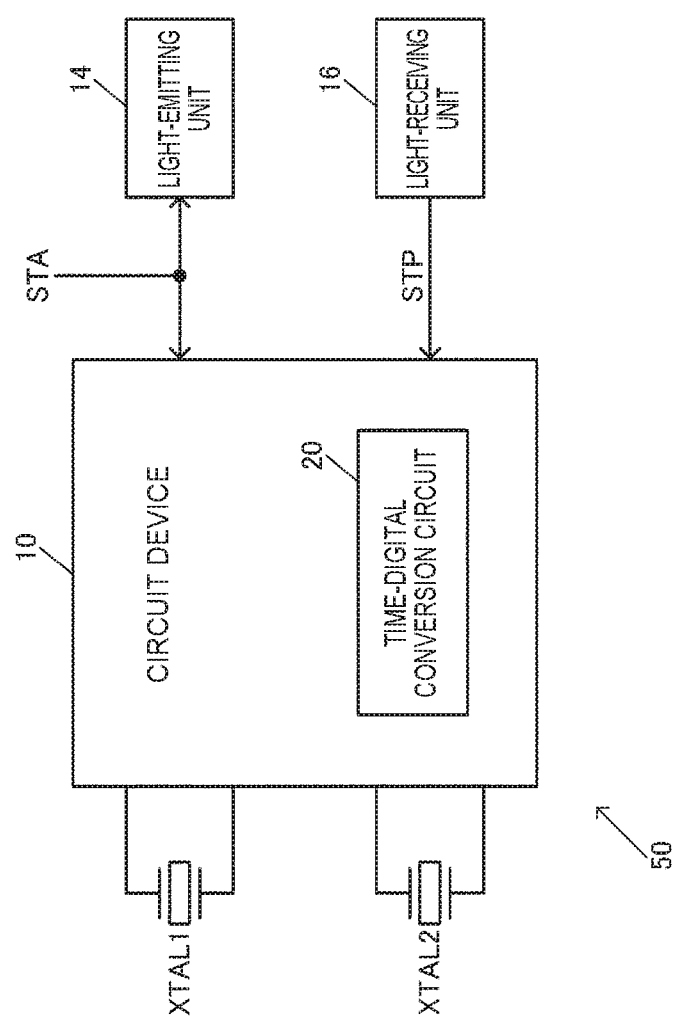
FIG. 16 illustrates a configuration example of the circuit device in the embodiment.

FIGS. 15 and 16 illustrate configuration examples of a circuit device 10 and a physical quantity measuring device 50 including the time-to-digital converter 20 in the embodiment. In FIG. 15, the circuit device 10 includes the time-to-digital converter 20, a control circuit 12, and the oscillation circuits 31 and 32. The control circuit 12 controls the time-to-digital converter 20 or performs various kinds of control processing of the circuit device 10. The oscillation circuit 31 generates the reference clock signal RCK1 by the oscillation operation using the oscillator XTAL1. The oscillation circuit 32 generates the reference clock signal RCK2 by an oscillation operation using an oscillator XTAL2. The oscillation circuit 31 is connected to the oscillator XTAL1 which is an external component, via terminals (pads) P1 and P2 of the circuit device 10. The oscillation circuit 32 is connected to the oscillator XTAL2 which is an external component, via terminals (pads) P3 and P4 of the circuit device 10. The oscillators XTAL1 and XTAL2 and the circuit device 10 constitute the physical quantity measuring device 50.

In FIG. 16, the circuit device 10 includes the time-to-digital converter 20. The oscillators XTAL1 and XTAL2 which are external components similar to FIG. 15 are connected to the circuit device 10. The physical quantity measuring device 50 includes the circuit device 10, the oscillators XTAL1 and XTAL2, a light-emitting unit 14, and a light-receiving unit 16.

The light-emitting unit 14 irradiates a target with light. The light-emitting unit 14 is realized, for example, by a light emitting element such as a laser device or an LED. For example, in a case where a processing device such as a microcomputer (not illustrated) is provided in the physical quantity measuring device 50, the signal STA from the processing device is input to the light-emitting unit 14, and thus the light-emitting unit 14 irradiates a target with light based on the signal STA. The signal STA is also input to the circuit device 10. The signal STA may be input to the light-emitting unit via an external connection terminal of the physical quantity measuring device 50, without providing such a processing device.

The light-receiving unit 16 receives light from the target. For example, the light-receiving unit 16 receives reflected light of the light applied by the light-emitting unit 14. The light-receiving unit 16 is realized, for example, by a light receiving element such as a photodiode. If the light-receiving unit 16 receives light, the signal STP is output to the circuit device 10. The circuit device 10 performs time-digital conversion based on the signals STA and STP.

Figure 17:
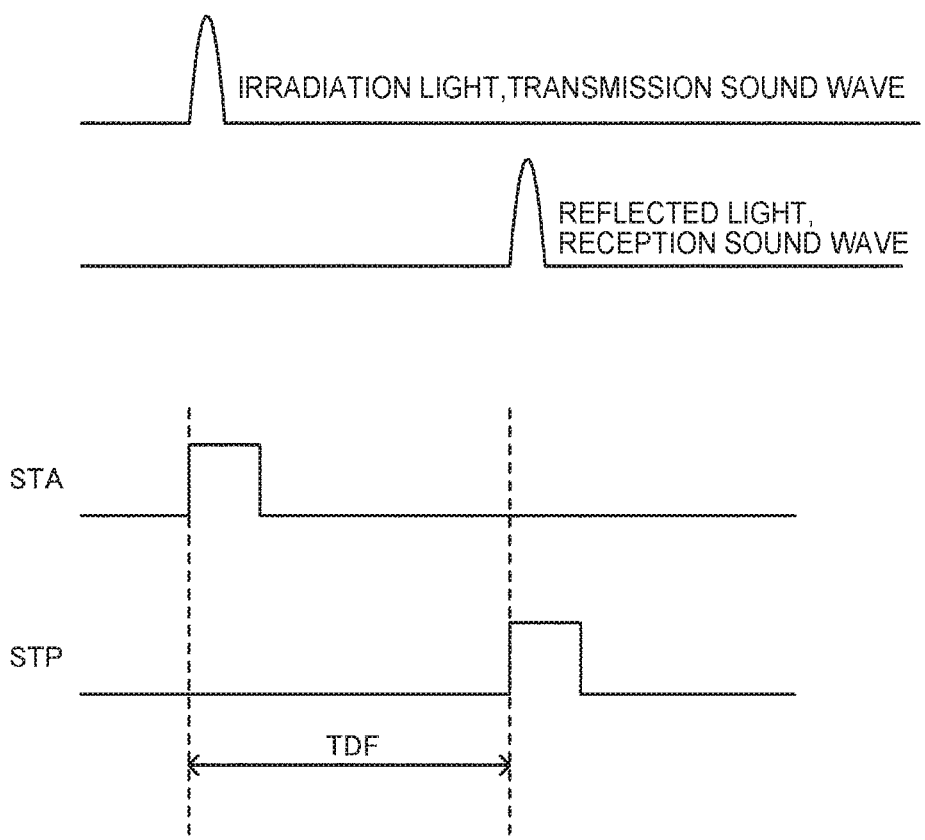
FIG. 17 is a diagram illustrating an example of measuring a physical quantity using signals.

For example, FIG. 17 illustrates a relationship between the signal STA (start signal) and the signal STP (stop signal). The time-to-digital converter 20 converts the time difference TDF in transition timing between the signals STA and STP into the digital value DQ. In FIG. 17, TDF indicates a time difference between transition timings when the signals STA and STP rise (between rising edges). However, TDF may indicate a time difference between transition timings when the signals STA and STP fall (between falling edges).

For example, in the embodiment, as illustrated in FIG. 17, irradiation light (for example, laser light) is emitted to a target (for example, object around a car) by using the signal STA. The signal STP is generated by receiving reflected light from the target. For example, the signal STP is generated by shaping the waveform of a received light signal. According to this configuration, it is possible to measure a distance from the target as the physical quantity, for example, in a manner of time of flight (TOF), by converting the time difference TDF in transition timing between the signals STA and STP into the digital value DQ. Thus, it is possible to use the measured distance for automated driving of cars and motion control of robots, for example. Alternatively, in the embodiment, a transmission sound wave (for example, ultrasonic wave) is transmitted to a target (for example, living body) by using the signal STA. The signal STP is generated by receiving a reception sound wave from the target. According to this configuration, it is possible to measure a distance and the like from the target and to, for example, measure biological information by the ultrasonic wave.

In FIG. 17, transmission data may be transmitted by the signal STA. A time from when the transmission data is transmitted until reception data is received may be measured by the signal STP generated by receiving the reception data. The physical quantity measured in the embodiment is not limited to the time and the distance. Various kinds of physical quantities such as a flow quantity, a flow rate, a frequency, a velocity, acceleration, an angular velocity, and angular acceleration are considered.

5. Electronic Apparatus and Vehicle

Figure 18:
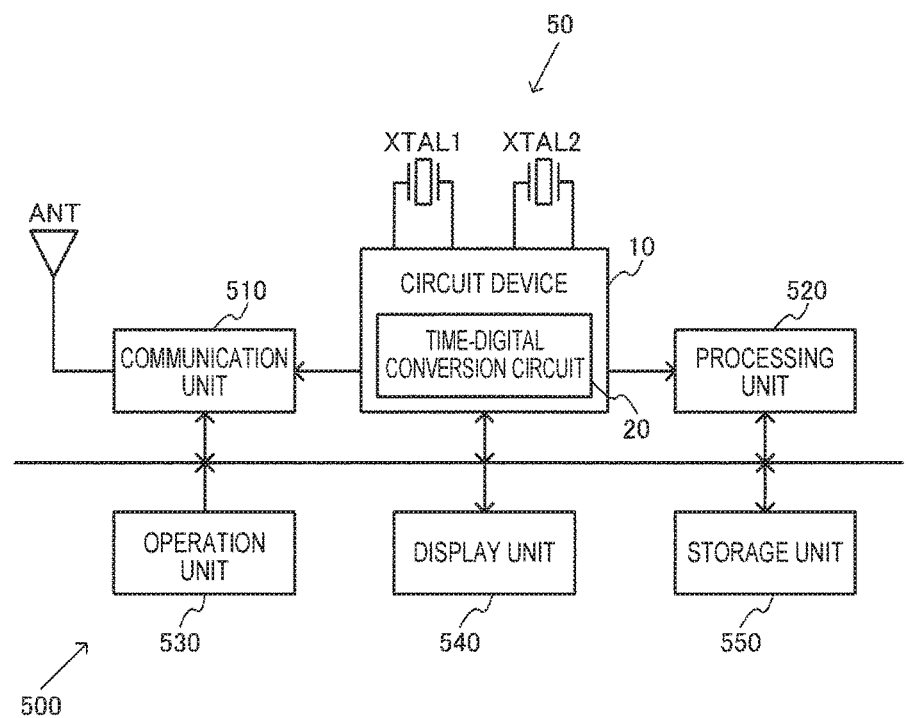
FIG. 18 illustrates a configuration example of an electronic apparatus.

FIG. 18 illustrates a configuration example of an electronic apparatus 500 including the circuit device 10 (time-to-digital converter 20) in the embodiment. The electronic apparatus 500 includes the circuit device 10, the oscillators XTAL1 and XTAL2, and a processing unit 520. The circuit device 10 includes the time-to-digital converter 20. The electronic apparatus 500 may include a communication unit 510, an operation unit 530, a display unit 540, a storage unit 550, and an antenna ANT. As the electronic apparatus 500, for example, the followings can be assumed: a measuring device that measures the physical quantity such as a distance, a time, a flow rate, and a flow quantity; a biological information measuring device that measures biological information (ultrasonic measuring device, pulse wave meter, and the like); an in-vehicle device (device for automatic driving and the like); and a network-related device such as a base station or a router. In addition, the followings can be assumed: a wearable device such as a head-mounted display device or a clock-related device; a robot, a printing device, a projection device, a portable information terminal (such as a smartphone), a content providing device that distributes contents; and a video device such as a digital camera or a video camera.

The communication unit (wireless circuit) 510 performs processing of receiving data from the outside of the equipment or transmitting data to the outside, via the antenna ANT. The processing unit (processing circuit) 520 performs control processing of the electronic apparatus 500 or various kinds of digital processing of data transmitted and received via the communication unit 510. The function of the processing unit 520 may be realized by a processor such as a microcomputer, for example. The operation unit 530 is used when a user performs an input operation. The operation unit may be realized by an operation button, a touch panel display, and the like. The display unit 540 displays various kinds of information and can be realized by a display of liquid crystal, organic EL, or the like. The storage unit 550 stores data. The function thereof can be realized by a semiconductor memory (such as a RAM or a ROM), an HDD (hard disk drive), or the like.

Figure 19:
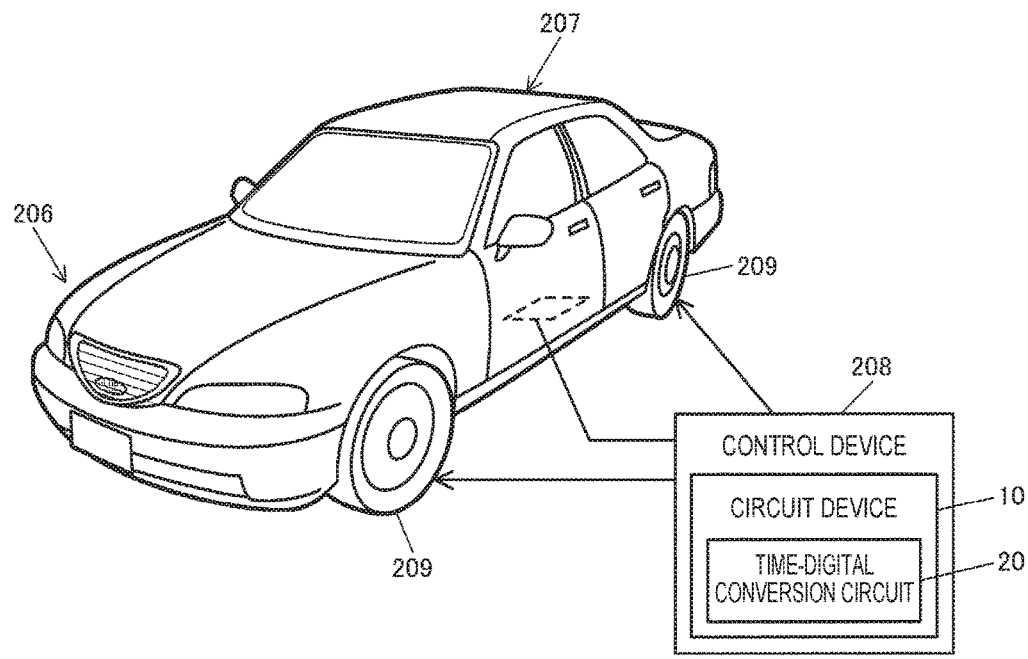
FIG. 19 illustrates a configuration example of a vehicle.

FIG. 19 illustrates an example of a vehicle including the circuit device 10 (time-to-digital converter 20) in the embodiment. The circuit device 10 (time-to-digital converter 20) in the embodiment can be incorporated into, for example, various vehicles such as cars, airplanes, motorcycles, bicycles, robots, and ships. The vehicle is equipment or a device that includes a driving mechanism such as an engine and a motor, a steering mechanism such as a steering wheel and a rudder, and various kinds of electronic apparatuses (in-vehicle equipment) and moves on the ground, the sky, or the sea. FIG. 19 schematically illustrates an automobile 206 as a specific example of the vehicle. The physical quantity measuring device (not illustrated) which includes the circuit device 10 and the oscillator in the embodiment is incorporated into the automobile 206. A control device 208 performs various kinds of control processing based on physical quantity information measured by the physical quantity measuring device. For example, in a case where distance information of an object around the automobile 206 is measured as the physical quantity information, the control device 208 performs various kinds of control processing for automatic driving, by using the measured distance information. The control device 208 controls the hardness of a suspension in accordance with the posture of a vehicle body 207 or controls the break for each wheel 209. A device into which the circuit device 10 (time-to-digital converter 20) in the embodiment is incorporated is not limited to such a control device 208. The device can be incorporated into various devices provided in a vehicle such as the automobile 206 or a robot.

As described above, the embodiment is specifically described. However, those skilled in the related art can easily understand that many modifications can be made without substantially departing from the novel matters and effects of the invention. Thus, all such modification examples are included in the scope of the invention. For example, in the specification or the drawings, the term (for example, processing circuit) described together with the different term (for example, arithmetic circuit) which is broader, or equivalent can be replaced with the different term at any point in the specification or the drawings, at least once. In addition, all combinations of the embodiment and the modification examples are included in the scope of the invention. The configurations and the operations of the time-to-digital converter, the circuit device, the physical quantity measuring device, the electronic apparatus, and the vehicle, the processing and the like of the time-to-digital converter or the processing circuit are not limited to those described in the embodiment and various modifications may be made.

The entire disclosure of Japanese Patent Application No. 2017-161967, filed Aug. 25, 2017 is expressly incorporated by reference herein.

What is claimed is:

1. A time-to-digital converter comprising:
a first oscillation circuit that starts an oscillation operation in accordance with a first signal and outputs a first clock signal;
a second oscillation circuit that starts an oscillation operation in accordance with a second signal and outputs a second clock signal;
a first sampling circuit that performs sampling of the first clock signal by a first reference clock signal and outputs a first output signal;
a second sampling circuit that performs sampling of the second clock signal by the first reference clock signal and outputs a second output signal; and
a processing circuit that obtains first frequency information and first phase information of the first clock signal and second frequency information and second phase information of the second clock signal based on the first output signal of the first sampling circuit and the second output signal of the second sampling circuit, and obtains a digital value corresponding to a time difference of a transition timing between the first signal and the second signal based on the first frequency information, the second frequency information, the first phase information, and the second phase information.

2. The time-to-digital converter according to claim 1, wherein the processing circuit includes
a counter that performs a counting operation based on the first reference clock signal, and
a storage circuit that fetches first clock count number information based on a count value of the counter at a timing corresponding to a transition timing of the first output signal and second clock count number information based on a count value of the counter at a timing corresponding to a transition timing of the second output signal.

3. The time-to-digital converter according to claim 2, wherein the processing circuit further includes an arithmetic circuit that performs an arithmetic operation of the first frequency information, the second frequency information, the first phase information, and the second phase information based on the first clock count number information and the second clock count number information.

4. The time-to-digital converter according to claim 2, wherein the processing circuit is configured to
specify a first straight line and obtain first inclination information and first intercept information of the first straight line, based on a plurality of points in which a value on a first coordinate axis means a clock count number indicated by the first clock count number information, and a value on a second coordinate axis means a transition count value of the first output signal,
specify a second straight line and obtain second inclination information and second intercept information of the second straight line, based on a plurality of points in which a value on the first coordinate axis means a clock count number indicated by the second clock count number information, and a value on the second coordinate axis means a transition count value of the second output signal, and
obtain the first frequency information, the second frequency information, the first phase information, and the second phase information based on the first inclination information, the second inclination information, the first intercept information, and the second intercept information.

5. The time-to-digital converter according to claim 1, wherein the processing circuit
obtains first time information from a reference timing until a transition timing of the first signal and second time information from the reference timing until a transition timing of the second signal, and
obtains the digital value corresponding to the time difference of the transition timing between the first signal and the second signal based on the first time information and the second time information.

6. The time-to-digital converter according to claim 1, wherein the first oscillation circuit is a ring oscillator that starts the oscillation operation at a transition timing of the first signal, and
the second oscillation circuit is a ring oscillator that starts the oscillation operation at a transition timing of the second signal.

7. The time-to-digital converter according to claim 1, wherein, when a frequency of the first reference clock signal is set as f1, a frequency of the first clock signal is set as fa, and a frequency of the second clock signal is set as fb,
(f1/2)<fa<f1 and (f1/2)<fb<f1 are satisfied.

8. The time-to-digital converter according to claim 1, further comprising:
a third sampling circuit that performs sampling of a second reference clock signal by the first reference clock signal and outputs a third output signal;

a fourth sampling circuit that performs sampling of the first clock signal by the second reference clock signal and outputs a fourth output signal;

a fifth sampling circuit that performs sampling of the second clock signal by the second reference clock signal and outputs a fifth output signal; and a sixth sampling circuit that performs sampling of the first reference clock signal by the second reference clock signal and outputs a sixth output signal, wherein the processing circuit obtains the first frequency information and the first phase information of the first clock signal and the second frequency information and the second phase information of the second clock signal based on the first to sixth output signals of the first to sixth sampling circuits.

9. The time-to-digital converter according to claim 8, wherein the processing circuit obtains first time information from a reference timing which is a phase synchronization timing between the first reference clock signal and the second reference clock signal until a transition timing of the first signal and second time information from the reference timing until a transition timing of the second signal, and obtains the digital value corresponding to the time difference of the transition timing between the first signal and the second signal based on the first time information and the second time information.

10. The time-to-digital converter according to claim 8, wherein the processing circuit obtains the first frequency information, the second frequency information, the first phase information, and the second phase information by performing correction processing based on the third output signal of the third sampling circuit and the sixth output signal of the sixth sampling circuit.

11. The time-to-digital converter according to claim 8, wherein, when a frequency of the first reference clock signal is set as f1, a frequency of the second reference clock signal is set as f2, a frequency of the first clock signal is set as fa, and a frequency of the second clock signal is set as fb, f1 is different from f2, and (f1/2)<fa<f1, (f1/2)<fb<f1, (f2/2)<fa<f2, and (f2/2)<fb<f2 are satisfied.

12. A circuit device comprising:
the time-to-digital converter according to claim 1.

13. A physical quantity measuring device comprising:
the time-to-digital converter according to claim 1.

14. An electronic apparatus comprising:
the time-to-digital converter according to claim 1.

15. A vehicle comprising:
the time-to-digital converter according to claim 1.

* * * * *